United States Patent
Baldauf et al.

(10) Patent No.: US 8,835,255 B2
(45) Date of Patent: Sep. 16, 2014

(54) METHOD OF FORMING A SEMICONDUCTOR STRUCTURE INCLUDING A VERTICAL NANOWIRE

(71) Applicant: Globalfoundries Inc., Grand Cayman (KY)

(72) Inventors: Tim Baldauf, Dresden (DE); Stefan Flachowsky, Dresden (DE); Tom Hermann, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 78 days.

(21) Appl. No.: 13/747,907

(22) Filed: Jan. 23, 2013

(65) Prior Publication Data

US 2014/0206157 A1  Jul. 24, 2014

(51) Int. Cl.
*H01L 21/336* (2006.01)

(52) U.S. Cl.
USPC ............................................ 438/268; 977/762

(58) Field of Classification Search
USPC .......................... 438/268, 478, 481; 977/762
See application file for complete search history.

(56) References Cited

U.S. PATENT DOCUMENTS

2005/0236357 A1*  10/2005  Bakkers et al. ............... 216/2
2013/0092902 A1*   4/2013  Bao et al. .................... 257/29

\* cited by examiner

*Primary Examiner* — Reema Patel
(74) *Attorney, Agent, or Firm* — Amerson Law Firm, PLLC

(57) ABSTRACT

A method comprises providing a semiconductor structure comprising a substrate and a nanowire above the substrate. The nanowire comprises a first semiconductor material and extends in a vertical direction of the substrate. A material layer is formed above the substrate. The material layer annularly encloses the nanowire. A first part of the nanowire is selectively removed relative to the material layer. A second part of the nanowire is not removed. A distal end of the second part of the nanowire distal from the substrate is closer to the substrate than a surface of the material layer so that the semiconductor structure has a recess at the location of the nanowire. The distal end of the nanowire is exposed at the bottom of the recess. The recess is filled with a second semiconductor material. The second semiconductor material is differently doped than the first semiconductor material.

20 Claims, 14 Drawing Sheets

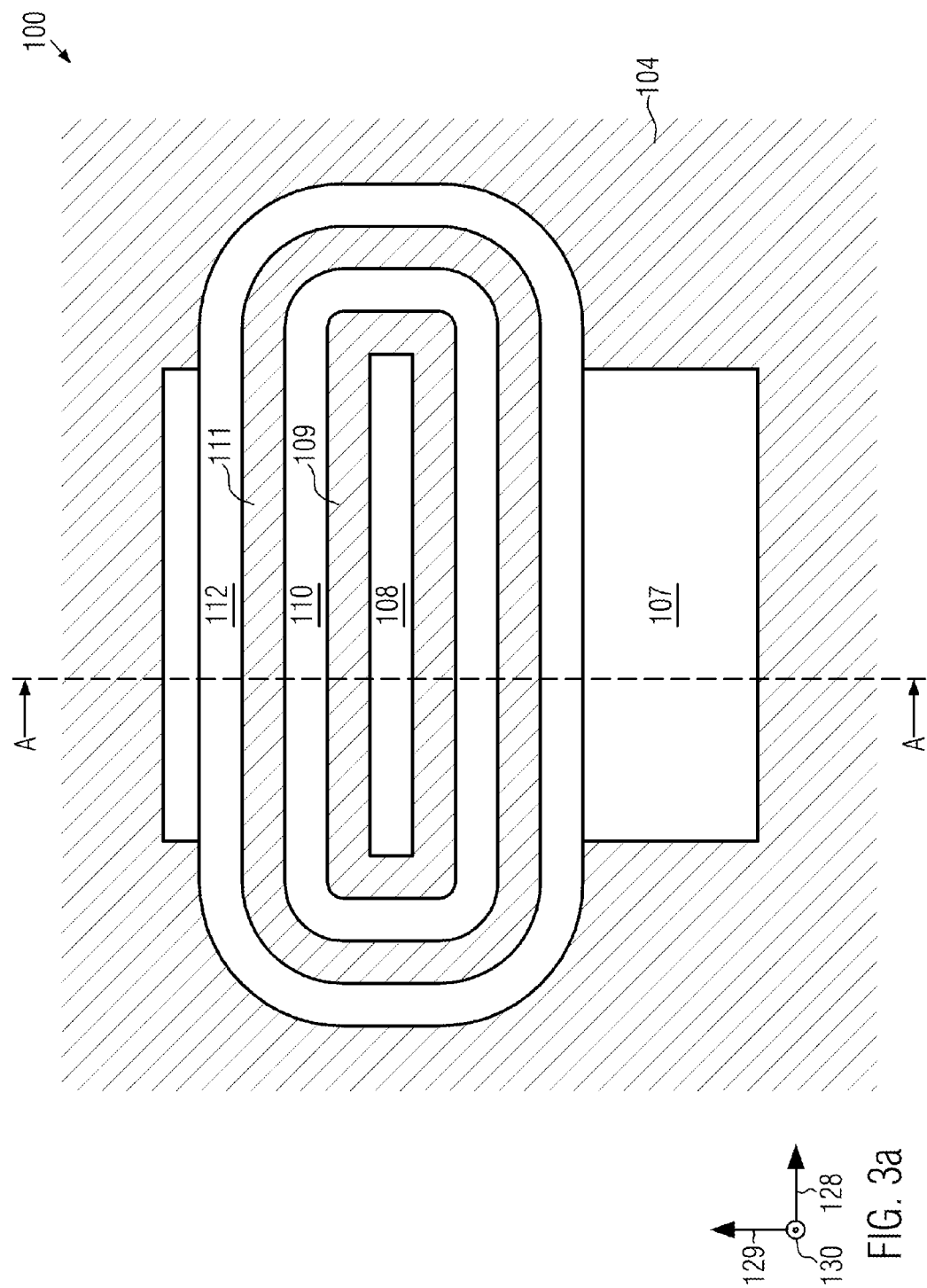

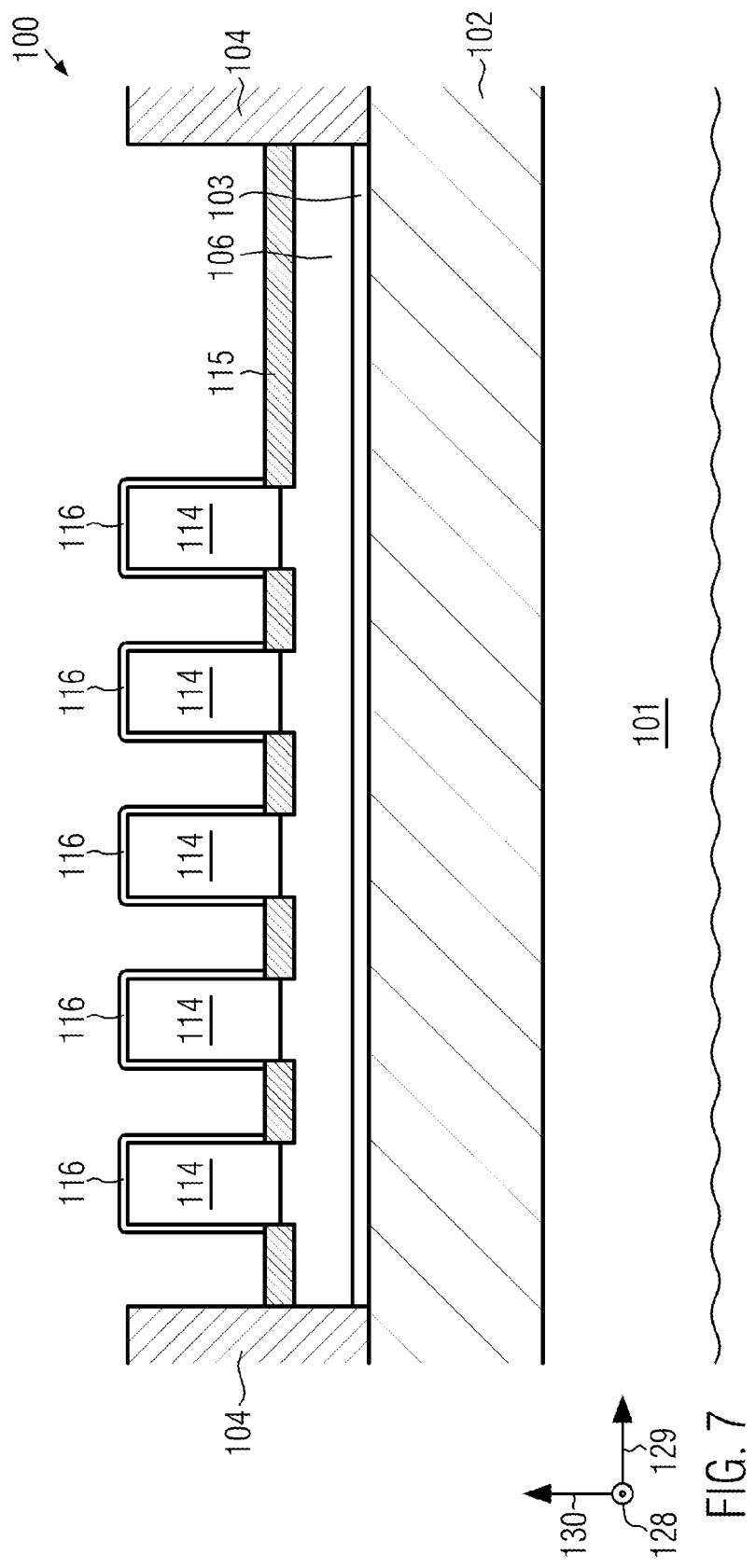

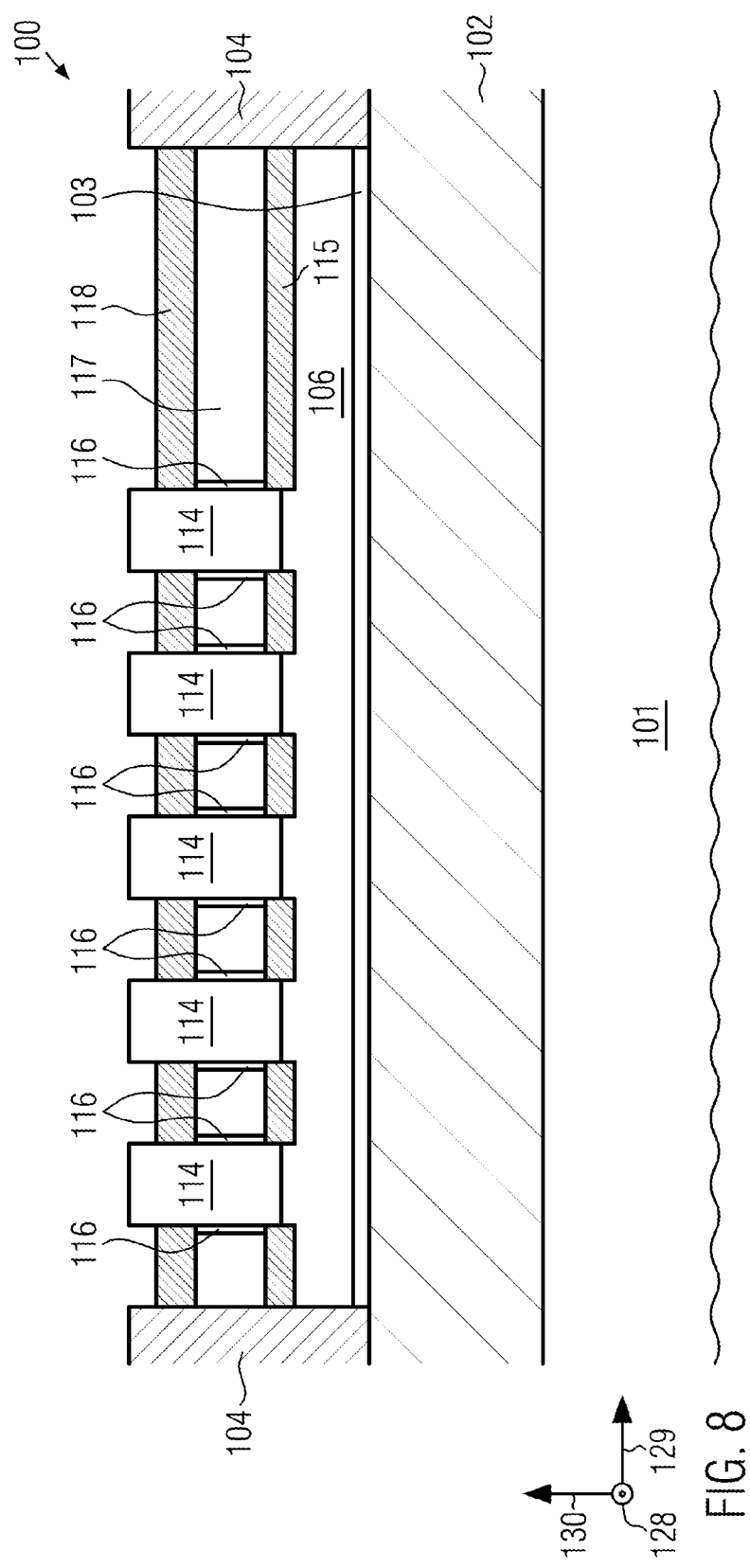

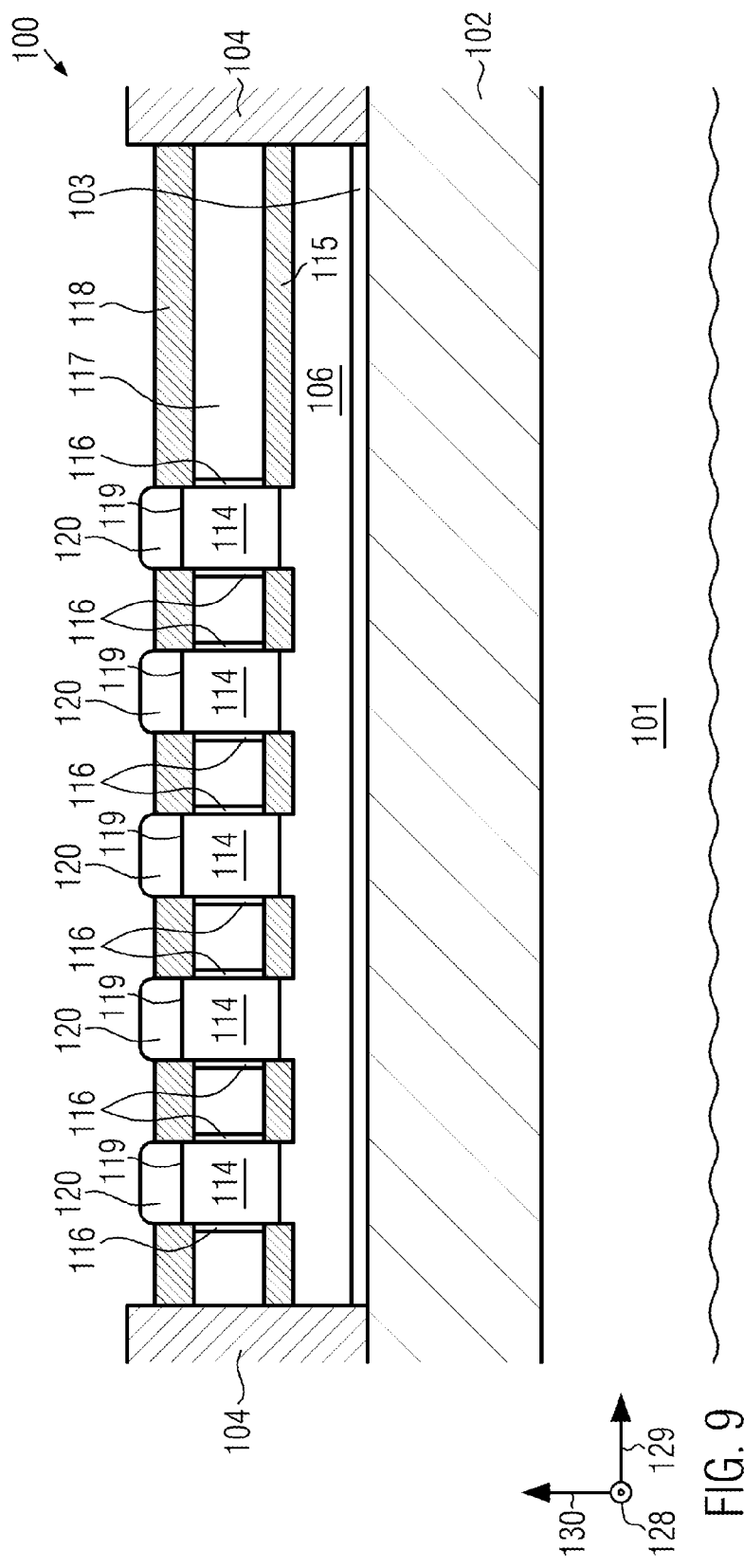

ic circuit, it has been proposed to use FinFET or tri-gate transistors, respectively, instead of planar field effect transistors. In FinFET and tri-gate transistors, the channel region and/or the source and drain regions, or portions of the source and drain regions, are formed in fins, which are elongated semiconductor elements extending along a horizontal direction of a substrate on which the transistors are formed. The gate electrode can be formed on two sides of the fins and, in the case of tri-gate transistors, also on top of the fins, so that the gate electrode is provided on three sides of the fins.

METHOD OF FORMING A SEMICONDUCTOR STRUCTURE INCLUDING A VERTICAL NANOWIRE

BACKGROUND OF THE INVENTION

1. Field of the Invention

Generally, the present disclosure relates to the field of integrated circuits, and, more particularly, to integrated circuits including vertical nanowires.

2. Description of the Related Art

Integrated circuits typically include a large number of circuit elements, which include, in particular, field effect transistors. In a field effect transistor, a gate electrode is provided that can be separated form a channel region by a gate insulation layer providing electrical insulation between the gate electrode and the channel region. Adjacent the channel region, a source region and a drain region are provided.

The channel region, the source region and the drain region can be formed of a semiconductor material, wherein the doping of the channel region is different from the doping of the source region and the drain region. Depending on an electric voltage applied to the gate electrode, the field effect transistor can be switched between an on-state and an off-state.

Field effect transistors can be planar field effect transistors, wherein the source region, the channel region and the drain region are formed in a semiconductor substrate or in a layer of a semiconductor material provided above a substrate. The source region, the channel region and the drain region are arranged along a horizontal direction of the substrate that is substantially perpendicular to a vertical direction being a thickness direction of the substrate. Above the channel region, a gate electrode is formed, and a gate insulation layer may be provided between the gate electrode and the channel region for electrically insulating the gate electrode from the channel region.

For increasing the speed of operation of field effect transistors and for providing a higher density of integration of integrated circuits including field effect transistors, a reduction of the size of the field effect transistors may be required. If the size of a planar field effect transistor is reduced, a gate length corresponding to a distance between the source region and the drain region of the transistor is also reduced. This can lead to short channel effects, which include an increased leakage current and a worse sub-threshold slope of the field effect transistor.

For addressing some performance issues that can occur if planar field effect transistors are employed in an integrated circuit, it has been proposed to use FinFET or tri-gate transistors, respectively, instead of planar field effect transistors. In FinFET and tri-gate transistors, the channel region and/or the source and drain regions, or portions of the source and drain regions, are formed in fins, which are elongated semiconductor elements extending along a horizontal direction of a substrate on which the transistors are formed. The gate electrode can be formed on two sides of the fins and, in the case of tri-gate transistors, also on top of the fins, so that the gate electrode is provided on three sides of the fins.

Thus, an electric voltage applied to the gate electrode of a FinFET or tri-gate transistor is provided on two or three sides of the channel region, respectively, which can improve the controllability of the channel region. However, similar to planar transistors, in FinFET and tri-gate transistors, the source, channel and drain regions are arranged along a horizontal direction of the substrate, requiring a relatively large amount of space for providing electrical contacts to the source and drain regions and for the gate length.

In view of the situation described above, methods that overcome or at least reduce some or all of the above-mentioned issues are provided. In particular, the present disclosure provides methods that may be employed for forming field effect transistors wherein the source, channel and drain region are arranged along a vertical direction of a substrate on which the transistors are formed. This may allow a reduction of the extension of the field effect transistors in horizontal directions of the substrate, without requiring a scaling of the gate length of the transistors. Furthermore, the present disclosure provides methods that may allow the formation of field effect transistors having an improved controllability of the channel.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a substrate and a nanowire provided above the substrate. The nanowire includes a first semiconductor material and extends in a vertical direction of the substrate. A material layer annularly enclosing the nanowire is formed above the substrate. A first part of the nanowire is selectively removed relative to the material layer. A second part of the nanowire is not removed. A distal end of the second part of the nanowire distal from the substrate is closer to the substrate than a surface of the material layer, so that the semiconductor structure has a recess at a location of the nanowire. The distal end of the nanowire is exposed at the bottom of the recess. The recess is filled with a second semiconductor material. The second semiconductor material is differently doped than the first semiconductor material.

A further illustrative method disclosed herein includes providing a semiconductor-on-insulator structure including a substrate, a dielectric layer on the substrate and a first semiconductor layer on the dielectric layer. A thickness of the first semiconductor layer is reduced. After reducing the thickness of the first semiconductor layer, a second semiconductor layer is epitaxially deposited on the first semiconductor layer. The second semiconductor layer includes a first portion provided on the first semiconductor layer and a second portion provided on the first portion of the second semiconductor layer. A doping of the first portion of the second semiconductor layer is different from a doping of the second portion of the second semiconductor layer. The second portion of the second semiconductor layer is patterned. The patterning forms a nanowire extending in a vertical direction of the substrate. A part of the first portion of the semiconductor layer that is adjacent the nanowire and is not covered by the nanowire remains in the semiconductor structure.

BRIEF DESCRIPTION OF THE DRAWINGS

The disclosure may be understood by reference to the following description taken in conjunction with the accompanying drawings, in which like reference numerals identify like elements, and in which:

FIGS. 3a and 3b show schematic views of a semiconductor structure in a stage of a method according to the present disclosure, wherein FIG. 3a shows a schematic top view and FIG. 3b shows a schematic cross-sectional view;

FIGS. 6a and 6b show schematic views of a semiconductor structure in a stage of a method according to the present disclosure, wherein FIG. 6a shows a schematic top view and FIG. 6b shows a schematic cross-sectional view;

FIG. 7 shows a schematic cross-sectional view of a semiconductor structure in a stage of a method according to the present disclosure;

FIG. 8 shows a schematic cross-sectional view of a semiconductor structure in a stage of a method according to the present disclosure;

FIG. 9 shows a schematic cross-sectional view of a semiconductor structure in a stage of a method according to the present disclosure; and FIGS. 10a-10c show schematic views of a semiconductor structure in a stage of a method according to the present disclosure, wherein FIG. 10a shows a schematic top view and FIGS. 10b and 10c show schematic cross-sectional views.

Figure 1:
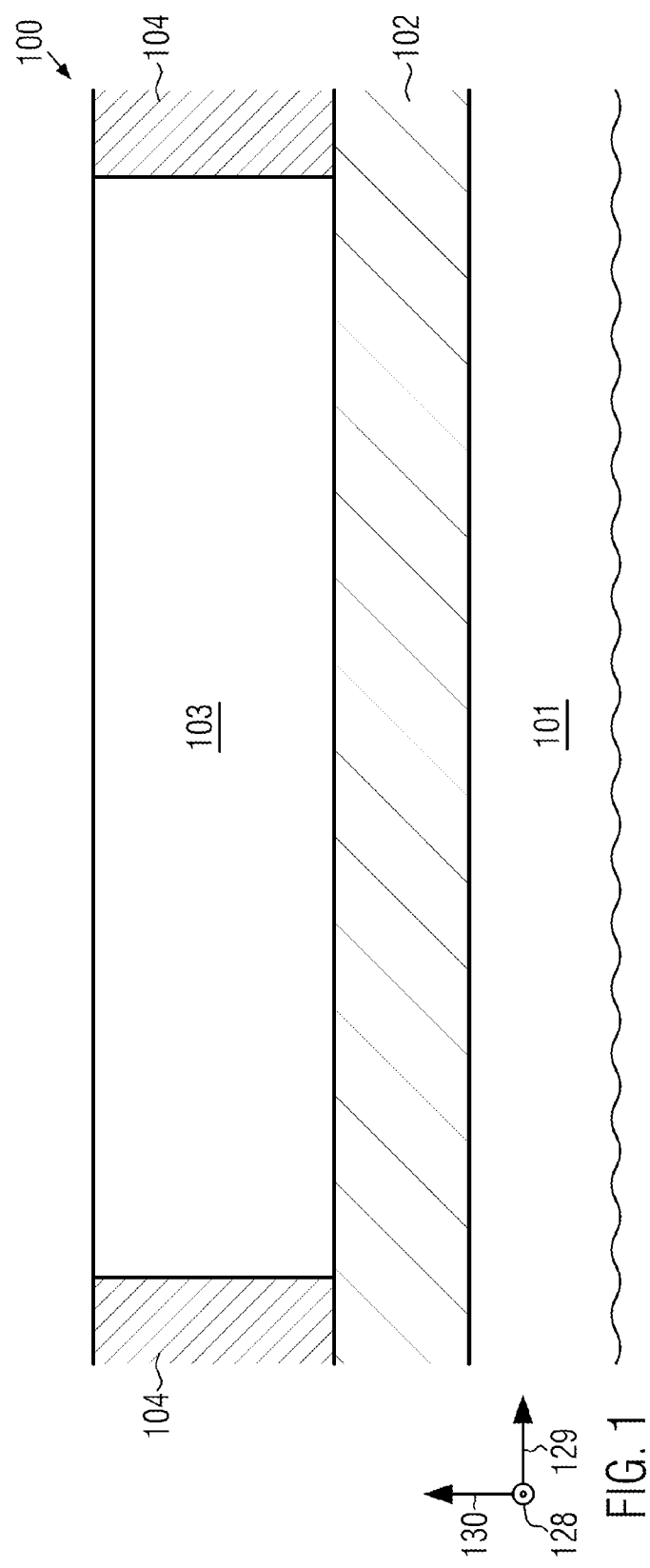
FIG. 1 shows a schematic cross-sectional view of a semiconductor structure in a stage of a method according to the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

FIG. 1 shows a schematic cross-sectional view of a semiconductor structure 100 in a stage of a method according to an embodiment. The semiconductor structure 100 includes a substrate 101 that may be formed of a semiconductor material, for example, silicon. The substrate 101 has a thickness direction 130 (vertical in the plane of drawing of FIG. 1) or vertical direction, respectively. An extension of the substrate 101 in the vertical direction 130 may be smaller than extensions of the substrate 101 in a first horizontal direction 128 and a second horizontal direction 129 which are perpendicular to each other and to the vertical direction 130 of the substrate 101.

In the figures, directions that are perpendicular to the plane of drawing are shown as arrows, a direction pointing towards the viewer is shown as a circle with a dot, and a direction pointing away from the viewer is shown as a circle with an "x".

The substrate 101 may have a top surface and a bottom surface that are substantially perpendicular to the vertical direction 130 of the substrate 101. The substrate 101 may have the shape of a disc or a plate.

The semiconductor structure 100 further includes a semiconductor layer 103 and a dielectric layer 102. The dielectric layer 102 is provided between the semiconductor layer 103 and the substrate 101. The dielectric layer 102 separates the semiconductor layer 103 from the substrate 101, and provides electrical insulation between the semiconductor layer 103 and the substrate 101. The dielectric layer 102 may include a dielectric material such as silicon dioxide, silicon oxynitride and/or silicon nitride, and the semiconductor layer 103 may include a semiconductor material, such as silicon, silicon/germanium, silicon carbide and/or a III-V semiconductor such as gallium arsenide. The semiconductor layer 103 may be substantially undoped. The substrate 101, the dielectric layer 102 and the semiconductor layer 103 form a semiconductor-on-insulator (SOI) structure.

The semiconductor structure 100 further includes a trench isolation structure 104. The trench isolation structure 104 may be a shallow trench isolation structure. The trench isolation structure 104 may enclose the portion of the semiconductor layer 103 shown in FIG. 1 and may provide electrical insulation between the enclosed portion of the semiconductor layer 103 and other portions of the semiconductor layer 103 that are not shown in FIG. 1.

The formation of the semiconductor structure 100 may include applying techniques for forming a semiconductor-on-insulator structure that may include providing a first semiconductor wafer and a second semiconductor wafer. The first semiconductor wafer includes the semiconductor material of the substrate 101 and the second semiconductor wafer includes the semiconductor material of the semiconductor layer 103. One of the wafers, or both wafers, may have a layer of the dielectric material of the dielectric layer 102 formed thereon. The wafers may be bonded to each other, wherein the dielectric layer 102 is located between the wafers. Then, the second wafer including the semiconductor material of the semiconductor layer 103 may be cleaved. Thereafter, a polishing process, for example, chemical mechanical polishing (CMP), may be performed to provide a substantially smooth surface of the semiconductor layer 103.

After the formation of the semiconductor-on-insulator structure, the trench isolation structure 104 may be formed by means of processes for forming a shallow trench isolation including photolithography, etching, oxidation and/or deposition.

In the configuration shown in FIG. 1, the semiconductor layer 103 may have a thickness in a range from about 10 nm, corresponding to a thickness of a semiconductor layer in an ultra-thin body semiconductor-on-insulator wafer (UTB-SOI-wafer), to about 100 nm, corresponding to a thickness of a semiconductor layer in a normal semiconductor-on-insulator wafer.

Figure 2:
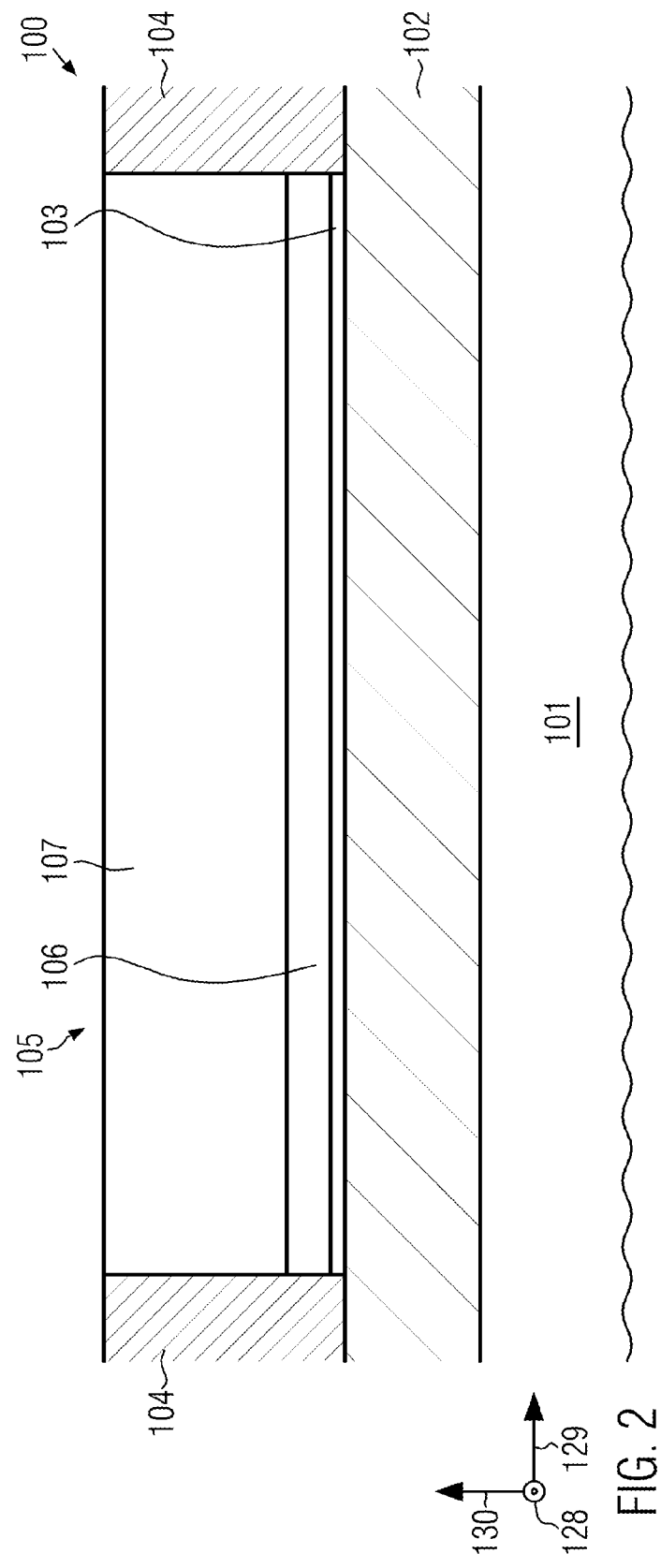
FIG. 2 shows a schematic cross-sectional view of a semiconductor structure in a stage of a method according to the present disclosure.

FIG. 2 shows a schematic cross-sectional view of the semiconductor structure 100 in a later stage of the manufacturing process. A thickness of the semiconductor layer 103, being an extension of the semiconductor layer 103 in the vertical direction 130, may be reduced. After the reduction of the thickness of the semiconductor layer 103, the semiconductor layer 103 may have a thickness in a range from about 5-10 nm.

The reduction of the thickness of the semiconductor layer 103 may include an etch process adapted to selectively remove the semiconductor material of the semiconductor layer 103 relative to the material of the trench isolation structure 104. In the selective etching of a first material relative to a second material, both materials are exposed to an etchant adapted to remove the first material at a greater etch rate than the second material. The etch rate of a material specifies a thickness of a portion of a layer of the material that is removed per time unit when the material is exposed to the etchant, wherein the thickness is measured in a direction perpendicular to the surface of the material.

The etch process used for reducing the thickness of the semiconductor layer 103 may be a dry etch process, for example, a reactive ion etch (RIE) process adapted to selectively remove the material of the semiconductor layer 103 relative to the material of the trench isolation structure 104. For example, in embodiments wherein the semiconductor layer 103 includes silicon and the trench isolation structure 104 includes silicon dioxide, the etch process may be a reactive ion etch process wherein an etch gas including $CF_4$ is used. The thickness of the semiconductor layer 103 need not be reduced by means of an etch process. Alternatively or additionally, a chemical mechanical polishing process may be used. In chemical mechanical polishing, the semiconductor structure 100 is moved relative to a polishing pad, and a slurry is supplied to an interface between the semiconductor structure 100 and the polishing pad. Materials on the surface of the semiconductor structure 100, in particular the material of the semiconductor layer 103, are removed by chemical reactions between the material of the semiconductor layer 103 and chemical compounds in the slurry and/or by mechanical interactions between the material of the semiconductor layer 103 and the polishing pad. In the chemical mechanical polishing process, a part of the trench isolation structure 104 may also be removed, so that the thickness of the trench isolation structure is reduced.

After the reduction of the thickness of the semiconductor layer 103, an epitaxial growth process may be performed for epitaxially depositing a semiconductor layer 105 on the semiconductor layer 103. Due to the epitaxial deposition of the semiconductor layer 105, the semiconductor material of the semiconductor layer 105 may adapt to the crystalline structure of the semiconductor material of the semiconductor layer 103. Thus, a substantially single-crystalline structure of the semiconductor layer 105 may be obtained.

The epitaxial growth process may be adapted for selectively depositing semiconductor material on the semiconductor layer 103, wherein substantially no semiconductor material is deposited on exposed surface portions of the trench isolation structure 104 and/or only a small amount of semiconductor material is deposited on exposed surface portions of the trench isolation structure 104.

In some embodiments, portions of the semiconductor structure 100 on which no semiconductor material is to be deposited (not shown in FIG. 1) may be covered by a mask, for example, a hardmask including silicon nitride or silicon dioxide, while the semiconductor layer 105 is deposited. Due to the selectivity of the epitaxial growth process, substantially no semiconductor material or only a small amount of semiconductor material is deposited on the mask. Moreover, the portion of the semiconductor structure 100 shown in FIG. 2 may be covered by a mask while a selective epitaxial growth process for depositing semiconductor material in other portions of the semiconductor structure is performed.

Thus, different semiconductor materials and/or differently doped semiconductor material may be provided in different portions of the semiconductor structure 100. Differently doped semiconductor materials may be used for forming N-channel transistors and P-channel transistors in portions of the semiconductor structure 100.

The selective epitaxial growth process may be a chemical vapor deposition process or a plasma enhanced chemical vapor deposition process, wherein parameters of the deposition process, such as composition and pressure of a reactant gas, temperature and/or a power of an electric discharge created in the reactant gas, are adapted such that a selective deposition of semiconductor material on the semiconductor layer 103 is obtained.

For example, in embodiments wherein the semiconductor layers 103, 105 include silicon, the selective epitaxial growth process used for forming the semiconductor layer 105 on the semiconductor layer 103 may be a chemical vapor deposition process or plasma enhanced chemical vapor deposition process wherein an etch gas including a chemical compound including silicon and chlorine, for example $SiCl_4$, $SiHCl_3$ and/or $SiH_2Cl_2$, is used. Alternatively, the etch gas can include a mixture of a chemical compound including silicon, for example, $SiH_4$, and a substance including chloride, for example, HCl and/or $Cl_2$.

The chlorine may react chemically with silicon atoms on the surface of the trench isolation structure 104 and/or the mask, wherein gaseous reaction products that are not bound to the surface are formed so that the silicon atoms are removed. Silicon atoms deposited on the surface of the semiconductor layer 103 and/or on silicon already deposited on the semiconductor layer 103 react with chlorine to a lower extent, so that growth of silicon is obtained on the surface of the semiconductor layer 103.

The selective epitaxial growth process need not be a chemical vapor deposition process or a plasma enhanced chemical vapor deposition process. Alternatively, molecular beam epitaxy (MBE) or metal organic chemical vapor deposition (MOCVD) may be used.

The semiconductor layer 105 may include portions 106, 107, wherein a doping of the portion 106 is different from a doping of the portion 107. The portion 106 may be provided between the semiconductor layer 103 and the portion 107 of the semiconductor layer 105 and may be P-doped or N-doped. In some embodiments, the portion 106 of the semiconductor layer 105 may include an N-type dopant, such as arsenic (As), or a P-type dopant, such as boron (B). A concentration of the dopant may be in a range from about $10^{15}$ $cm^3$ to about the solid solubility limit of each dopant (which can be approximately $10^{21}$ $cm^{-3}$), for example about $10^{20}$ $cm^{-3}$. The portion 107 of the semiconductor layer 105 that is provided above the portion 106 may be substantially undoped or the portion 107 may be doped inversely to the doping of the portion 106 of the semiconductor layer 105. In embodiments wherein the portion 107 of the semiconductor layer 105 is doped inversely to the doping of the portion 106, the portion 107 may be P-doped if the portion 106 is N-doped, and the portion 107 may be N-doped if the portion 106 is P-doped.

As will be detailed in the following, a transistor may be formed in the semiconductor structure 100, wherein a drain region of the transistor is formed from the portion 106 of the semiconductor layer 105, and a channel region is formed from the portion 107. In embodiments wherein the transistor to be formed is an N-type transistor, the portion 106 of the semiconductor layer 105 may be N-doped, and in embodiments wherein the transistor to be formed is a P-channel transistor, the portion 106 of the semiconductor layer 105 may be P-doped.

A thickness of the portion 106 of the semiconductor layer 105, measured in the vertical direction 130 of the substrate 101 (vertical in the plane of drawing of FIG. 2) may be greater than the reduced thickness of the semiconductor layer 103 that is obtained after reducing the thickness of the first semiconductor layer 103.

In some embodiments, the thickness of the portion 106 of the semiconductor layer 105 may be greater than five times the reduced thickness of the semiconductor layer 103 and/or greater than ten times the reduced thickness of the semiconductor layer 103. For example, the reduced thickness of the semiconductor layer 103 may be in a range from about 5-10 nm, and the portion 106 of the semiconductor layer 105 may have a thickness in a range from about 50-60 nm.

Thus, a drain region of the transistor formed in the semiconductor structure 100 that is located close to the dielectric layer 102 may be obtained. A relatively low thickness of the portion of the semiconductor layer 103 remaining in the semiconductor structure 100 after the reduction of the thickness of the semiconductor layer 103 may be sufficient to provide a substantially single crystalline structure of the semiconductor layer 105, while having only a small or substantially no influence on the electric characteristics of the transistor.

The thickness of the portion 107 of the semiconductor layer 105 may be greater than the thickness of the portion 106 of the semiconductor layer 105 and/or greater than twice the thickness of the portion 106. In some embodiments, the portion 107 of the semiconductor layer 105 may have a thickness in a range from about 130-150 nm, for example, a thickness of about 140 nm.

The thickness of the portion 107 of the semiconductor layer may be greater than a sum of a gate length and a thickness of a source spacer of a transistor to be formed in the semiconductor structure 100. In an embodiment, the gate length may be approximately 26 nm (22 nm-Node), the thickness of the source spacer may be approximately 20 nm and the thickness of the portion 107 of the semiconductor layer 105 may be approximately 140 nm to provide additional tolerance. The gate length and the source spacer will be explained below.

The doping of the portions 106, 107 of the semiconductor layer 105 may be provided by in situ doping the material of the semiconductor layer 105 during the deposition process. For this purpose, a dopant or a chemical compound comprising the dopant may be supplied during the deposition of the material of the semiconductor layer, so that the dopant is included into the semiconductor layer 105. For forming a substantially undoped portion 107 of the semiconductor layer 105, a supply of dopant or chemical compound comprising a dopant may be omitted during the formation of the portion 107.

Figure 3B:
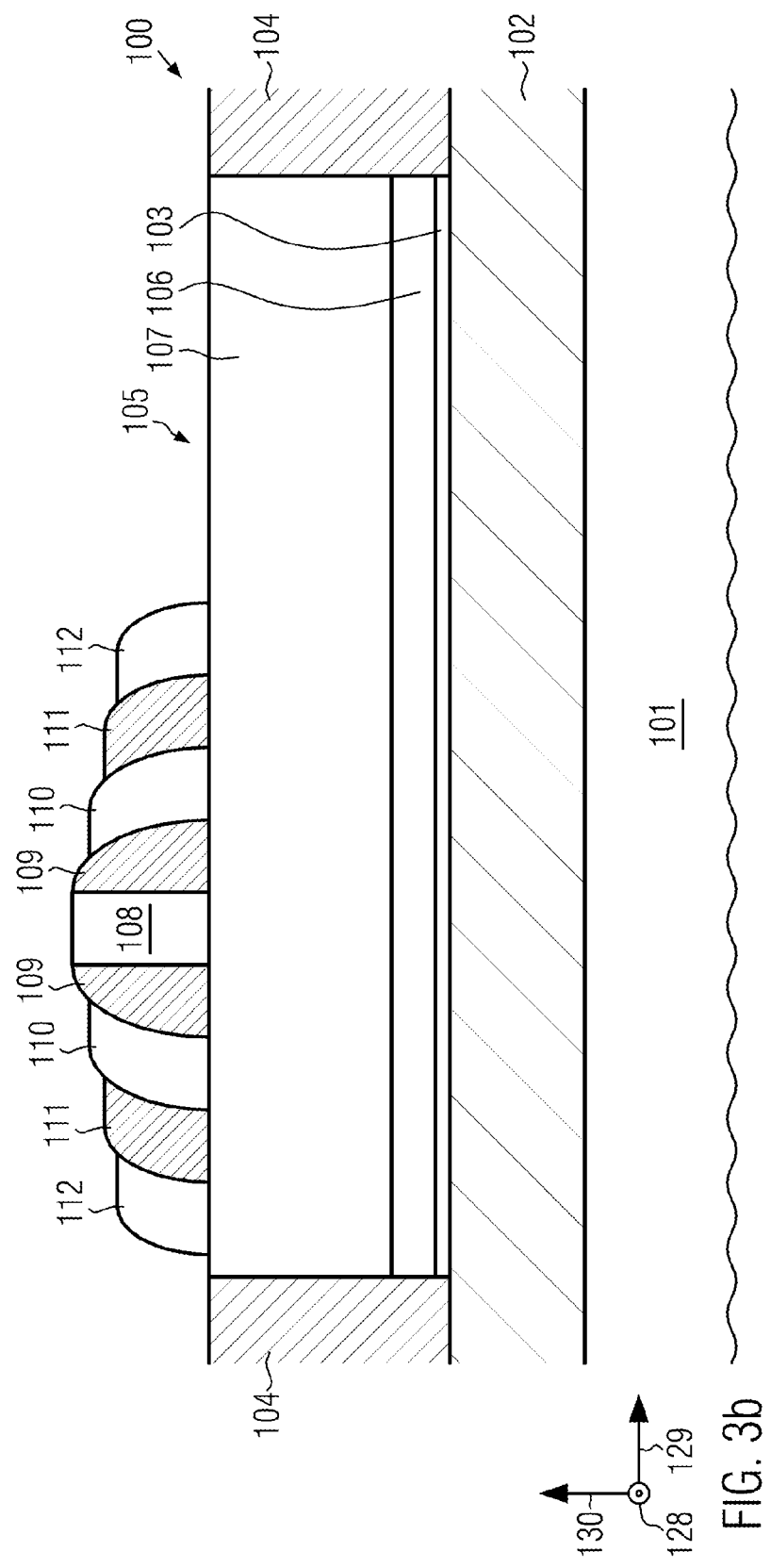

FIGS. 3a and 3b show schematic views of the semiconductor structure 100 in a later stage of the manufacturing process. FIG. 3a shows a schematic top view, and FIG. 3b shows a schematic cross-sectional view along the line A-A in FIG. 3a, corresponding to the cross-sectional views shown in FIGS. 1 and 2.

A first patterning of the portion of the semiconductor layer 105 enclosed by the trench isolation structure 104 is performed. In the first patterning process, a dummy structure 108 is formed on the semiconductor layer 105. The dummy structure 108 may include silicon nitride. Alternatively, the dummy structure 108 may include silicon dioxide or silicon oxynitride. The dummy structure 108 may have an elongated shape, wherein an extension of the dummy structure 108 in the first horizontal direction 128 (horizontal in the view of FIG. 3a) is greater than an extension of the dummy structure 108 in the second horizontal direction 129 (vertical in the view of FIG. 3a).

In the first horizontal direction 128, the dummy structure 108 may extend across the portion of the semiconductor layer 105 enclosed by the trench isolation structure 104, and/or ends of the dummy structure 108 may overlap with the trench isolation structure 104. The extension of the dummy structure 108 in the second horizontal direction 129 may be smaller than the extension of the portion of the semiconductor layer 105 enclosed by the trench isolation structure 104 in the second horizontal direction 129, so that a part of the portion of the semiconductor layer 105 enclosed by the trench isolation structure 104 is not covered by the dummy structure 108.

The dummy structure 108 need not be located at the center of the portion of the semiconductor layer 105 enclosed by the trench isolation structure 104. As shown in FIGS. 3a and 3b, a greater part of the portion of the semiconductor layer 105 enclosed by the trench isolation structure 104 may be located on a first side of the dummy structure 108 (below the dummy structure 108 in the view of FIG. 3a and to the right of the dummy structure 108 in the view of FIG. 3b) than on a second side of the dummy structure 108 (above the dummy structure 108 in the view of FIG. 3a and on the left of the dummy structure 108 in the view of FIG. 3b).

As will be detailed below, a drain contact via of the transistor to be formed in the semiconductor structure 100 may be provided in the part of the semiconductor structure 100 on the first side of the dummy structure 108. By not providing the dummy structure 108 at the center of the portion of the semiconductor layer 105 enclosed by the trench isolation structure 104, more space for forming the drain contact via may be provided compared to an arrangement in the center.

For forming the dummy structure 108, a layer of a material of the dummy structure 108, for example a layer of silicon nitride, silicon dioxide or silicon oxynitride, may be deposited by means of a deposition process, for example, by means of chemical vapor deposition or plasma enhanced chemical vapor deposition. Thereafter, the layer of the material of the dummy structure 108 may be patterned.

The patterning of the layer of the material of the dummy structure 108 may include a photolithography process. In some embodiments, a width of the dummy structure 108 in the second horizontal direction 129 may substantially correspond to a resolution of the photolithography process employed in the formation of the dummy structure 108. For example, the width of the dummy structure 108 in the second horizontal direction 129 may be less than twice the resolution of the photolithography process. The width of the dummy structure 108 in the second horizontal direction 129 may be in a range from about 30-40 nm.

In other embodiments, the width of the dummy structure 108 in the second horizontal direction 129 may be smaller than the resolution of the photolithography process used for forming the dummy structure 108. In such embodiments, the dummy structure 108 may first be formed with a greater width in the second horizontal direction 129, for example a width that substantially corresponds to the resolution of the photolithography process, and an etch process may then be performed for reducing the width of the dummy structure 108 in the second horizontal direction 129. Alternatively, multiple patterning processes may be employed for forming the dummy structure 108.

After the formation of the dummy structure 108, spacers 109, 110, 111, 112 may be formed adjacent the dummy structure 108. The spacers 110, 112 may be formed of substantially the same material as the dummy structure 108. The spacers 109, 111 may be formed of a material that can be selectively etched relative to the material of the dummy structure 108 and the spacers 110, 112.

In embodiments wherein the dummy structure 108 and the spacers 110, 112 are formed of silicon nitride, the spacers 109, 111 may include silicon dioxide or silicon oxynitride. In embodiments wherein the dummy structure 108 and the spacers 110, 112 are formed of silicon dioxide, the spacers 109, 111 may include silicon nitride or silicon oxynitride, and in embodiments wherein the dummy structure 108 and the spacers 110, 112 are formed of silicon oxynitride, the spacers 109, 111 may include silicon nitride or silicon dioxide.

Each of the spacers 109, 110, 111, 112 may be formed by substantially isotropically depositing a layer of the material of the respective spacer over the semiconductor structure 100 and then performing an anisotropic etch process.

In the anisotropic etch process, portions of the layer of the material of the spacer on substantially horizontal portions of the semiconductor structure 100, for example on the surface of the semiconductor layer 105, the top surface of the dummy structure 108 and the top surface of the trench isolation structure 104, are removed at a greater etch rate than portions of the layer on inclined portions of the semiconductor structure 100, such as the sidewalls of the dummy structure 108 and/or sidewalls of spacers that have already been formed.

The anisotropic etch process may be adapted to selectively remove the material of the spacer being formed relative to other materials on the semiconductor structure 100, in particular relative to the semiconductor material of the semiconductor layer 105 and/or the material of the feature adjacent the spacer to be formed, which can be the dummy structure 108 or another one of the spacers 109 to 112.

The anisotropic etch process may be stopped as soon as portions of the layer of the material of the spacer on substantially horizontal portions of the semiconductor structure 100 are removed. Due to the anisotropy of the etch process, portions of the material layer on inclined portions of the semiconductor structure 100 are not removed and form one of the spacers 109, 110, 111, 112.

Figure 4:
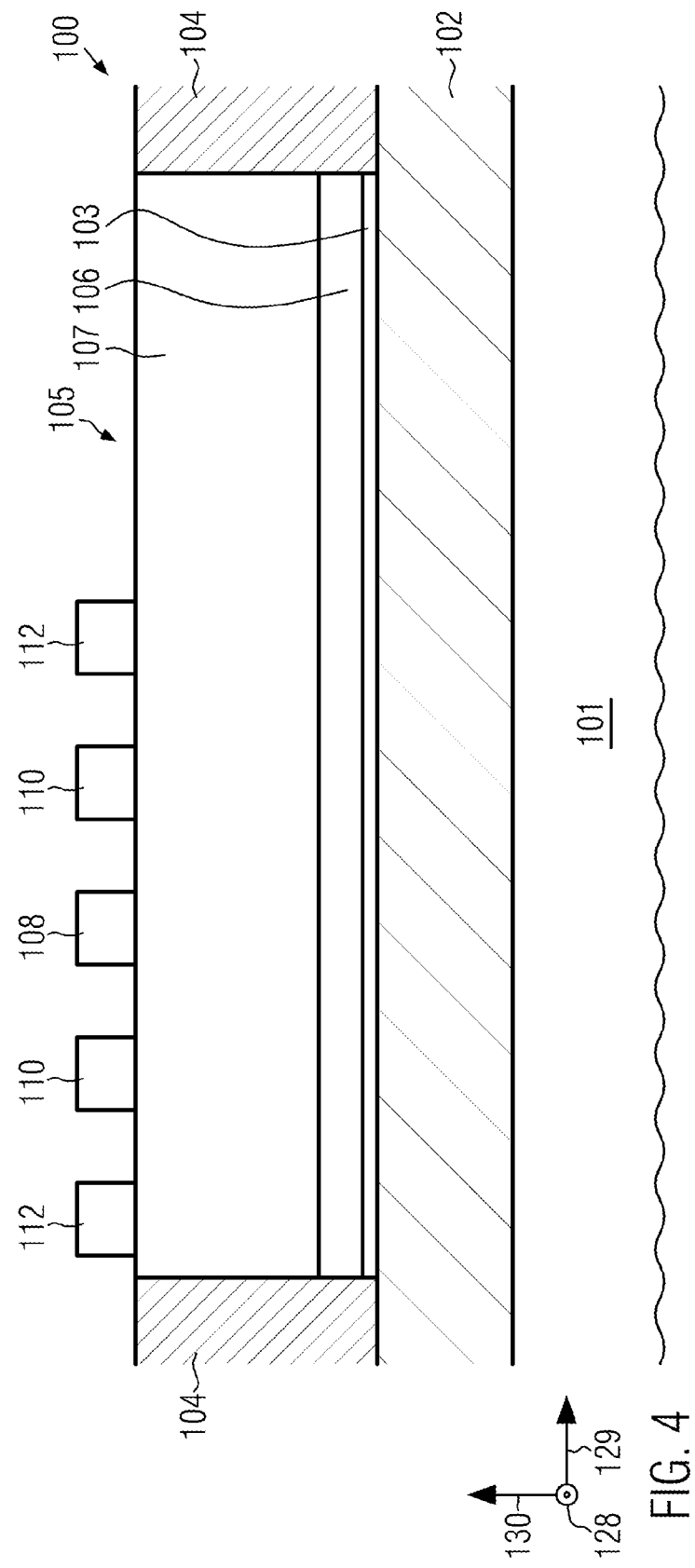
FIG. 4 shows a schematic cross-sectional view of a semiconductor structure in a stage of a method according to the present disclosure.

FIG. 4 shows a schematic cross-sectional view of the semiconductor structure 100 in a later stage of the manufacturing process. After the formation of the dummy structure 108 and the spacers 109, 110, 111, 112, a planarization of the semiconductor structure 100 may be performed. The planarization may include a chemical mechanical polishing process.

In some embodiments, after the formation of the dummy structure 108 and the spacers 109-112 and before the planarization, a sacrificial layer (not shown) of substantially the same material as the spacers 109, 111 may be formed over the semiconductor structure 100. The sacrificial layer may help to protect the semiconductor layer 105 and the trench isolation structure 104 during the planarization process and may be removed later in the manufacturing process, as will be detailed below. In other embodiments, the sacrificial layer may be omitted.

In the planarization, portions of the dummy structure 108 and the spacers 109-112 may be removed, so that the dummy structure 108 and the spacers 109-112 obtain a substantially equal thickness in the vertical direction 130 and each of the dummy structure 108 and the spacers 109-112 is exposed at the surface of the semiconductor structure 100. In embodiments wherein a sacrificial layer as described above is used, in the planarization, a portion of the sacrificial layer on top of the dummy structure 108 and the spacers 109-112 may be removed, whereas a portion of the sacrificial layer directly on the semiconductor layer 105 may remain on the semiconductor structure 100.

After the planarization process, the spacers 109, 111 and the optional sacrificial layer may be removed for exposing the semiconductor layer 105 with the exception of those portions that are covered by the dummy structure 108 and the spacers 110, 112. These features form masks extending across the portion of the semiconductor layer 105 enclosed by the trench isolation structure 104 along the first horizontal direction 128, as can be seen by comparing FIG. 4 with FIGS. 3a and 3b. Widths of the masks correspond to the widths of the dummy structure 108 and the spacers 110, 112. At the locations of the spacers 109, 111, gaps between the masks are provided, wherein a width of the gaps corresponds to the widths of the spacers 109, 111.

Figure 5:
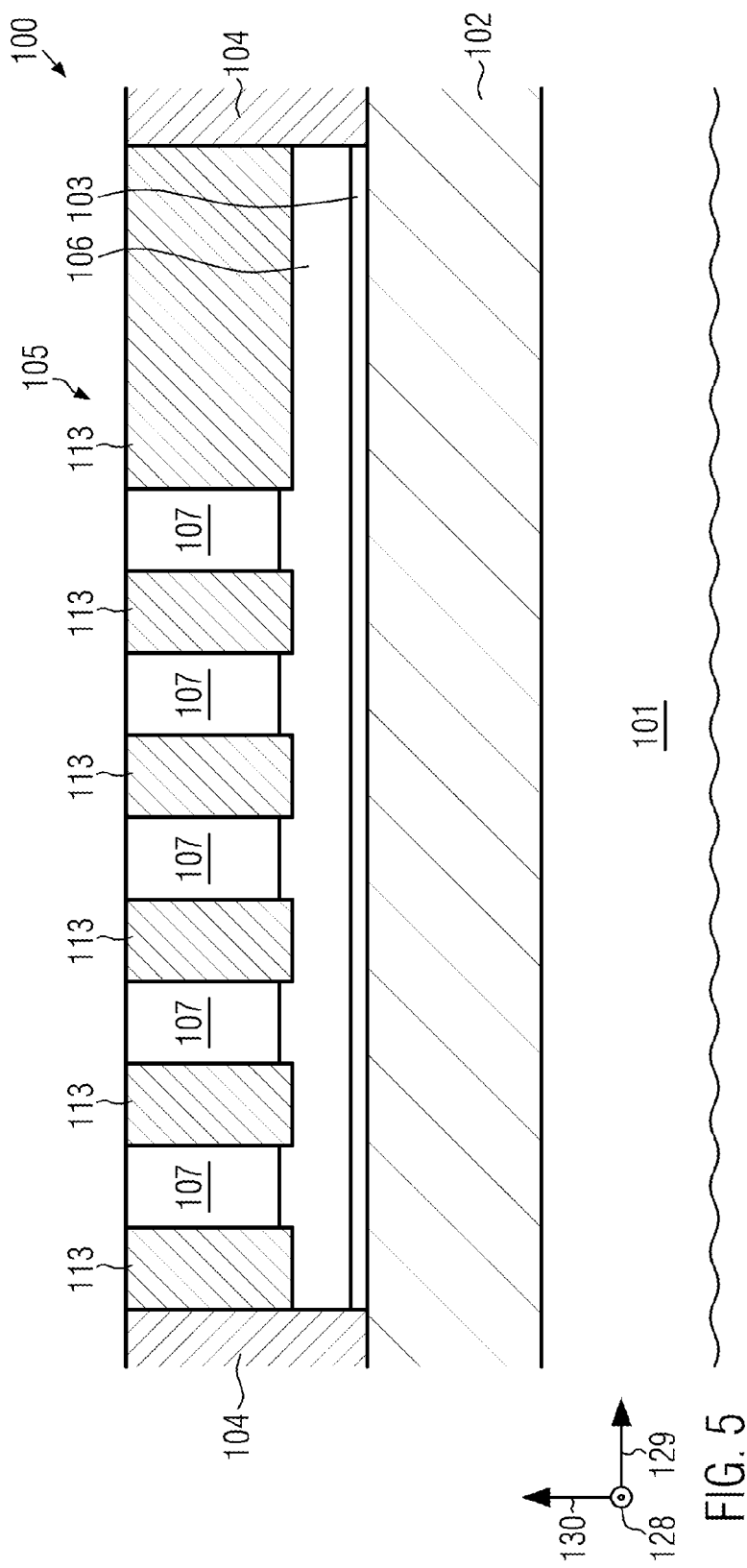
FIG. 5 shows a schematic cross-sectional view of a semiconductor structure in a stage of a method according to the present disclosure.

FIG. 5 shows a schematic cross-sectional view of the semiconductor structure 100 in a later stage of the manufacturing process. An etch process may be performed for partially removing portions of the semiconductor layer 105 that are not covered by the masks provided by the dummy structure 108 and the spacers 110, 112 (see FIG. 4). The etch process may be adapted to selectively remove the material of the semiconductor layer 105 relative to the materials of the dummy structure 108, the spacers 110, 112 and the trench isolation structure 104. In embodiments wherein the semiconductor layer 105 includes silicon and the dummy structure 108, the spacers 110, 112 and the trench isolation structure 104 include silicon dioxide, silicon oxynitride and/or silicon nitride, the etch process may be adapted to selectively etch silicon relative to silicon dioxide, silicon oxynitride and/or silicon nitride.

The etch process may be an anisotropic etch process wherein portions of the semiconductor layer 105 that are below the dummy structure 108 and the spacers 110, 112 are substantially not etched, so that the portions of the semiconductor layer 105 below the dummy structure 108 and the spacers 110, 112 remaining in the semiconductor structure 100 after the etch process form elongated semiconductor protrusions having substantially vertical sidewalls that extend along the vertical direction 130.

The portions of the semiconductor layer 105 that are not covered by the dummy structure 108 and the spacers 110, 112 are not completely removed in the etch process. Instead, the etch process may be adapted to substantially completely remove parts of the portion 107 of the semiconductor layer 105 that are not covered by the dummy structure 108 and the spacers 110, 112, whereas at least parts of the portion 106 of the semiconductor layer 105 may remain in substantially the entire area of the semiconductor structure 100 enclosed by the trench isolation structure 104. Moreover, the semiconductor layer 103 may remain in the semiconductor structure 100.

After the etch process, elongated semiconductor protrusions including parts of the portion 107 of the semiconductor layer 105 extend across the semiconductor structure 100 along the first horizontal direction 128. In the etch process, the semiconductor material of the semiconductor layer 105 may be etched to a greater depth than the thickness of the portion 107 of the semiconductor layer 105, so that the elongated semiconductor protrusions include parts of the portion 106 of the semiconductor layer 105, and there is a transition between the differently doped portions 106, 107 of the semiconductor layer 105 within each of the elongated semiconductor protrusions.

The width of the elongated semiconductor protrusions in the second horizontal direction 129 substantially corresponds to the width of the dummy structure 108 and the spacers 110, 112. Between the elongated semiconductor protrusions, there are grooves having a width substantially corresponding to a width of the spacers 109, 111. Thus, the width of the elongated semiconductor protrusions and the spacing between the elongated semiconductor protrusions may be controlled by selecting corresponding widths of the dummy structure 108 and the spacers 109-112.

In some embodiments, the width of the spacers 110, 112 may be substantially equal to a width of the dummy structure 108, so that all the elongated semiconductor protrusions have substantially the same width. In other embodiments, the width of the spacers 110, 112 may be smaller than the width of the dummy structure 108, so that the elongated semiconductor protrusion formed below the dummy structure 108 is wider than the elongated semiconductor protrusions formed below the spacers 110, 112.

The width of the spacers 109-112 depends on the thicknesses of the material layers that are isotropically deposited in the formation of the spacers 109-112 and the degree of anisotropy of the etch process performed in the formation of the spacers 109-112. Thus, the width of the spacers 109-112 is not limited by properties of a photolithography process, so that the widths of the elongated semiconductor protrusions formed below the spacers 110, 112 and the distance between the elongated semiconductor protrusions may be smaller than a resolution of the photolithography process employed in the formation of the dummy structure 108. In some embodiments, the spacers 109-112 may have a width in a range from about 5-20 nm.

After the etch process, the dummy structure 108 and the spacers 110, 112 that were used as a mask in the first patterning process may be removed. This can be done by means of an etch process adapted to selectively remove the material of the dummy structure 108 and the spacers 110, 112 relative to the materials of the semiconductor layer 105 and the trench isolation structure 104. In embodiments wherein the dummy structure 108 and the spacers 110, 112 include silicon nitride, the trench isolation structure 104 includes silicon dioxide and the semiconductor layer 105 includes silicon, the etch process may be adapted to selectively remove silicon nitride relative to silicon and silicon dioxide.

After the removal of the dummy structure 108 and the spacers 110, 112, the grooves between the elongated semiconductor protrusions formed from the semiconductor layer 105 and the space between the elongated semiconductor protrusions and the trench isolation structure 104 may be filled with a fill material 113. In some embodiments, this may be done by depositing a layer of the fill material 113 over the semiconductor structure 100. Thereafter, a planarization process, for example, a chemical mechanical polishing process, may be performed for providing a substantially planar surface of the semiconductor structure and for exposing the elongated semiconductor protrusions and/or for exposing the trench isolation structures 104.

The present disclosure is not limited to embodiments wherein the dummy structure 108 and the spacers 110, 112 are removed by means of an etch process as described above. Alternatively, the dummy structure 108 and the spacers 110, 112 may remain on the semiconductor structure 100 during the deposition of the fill material 113 and may be removed during the subsequent chemical mechanical polishing process.

Figure 6A:
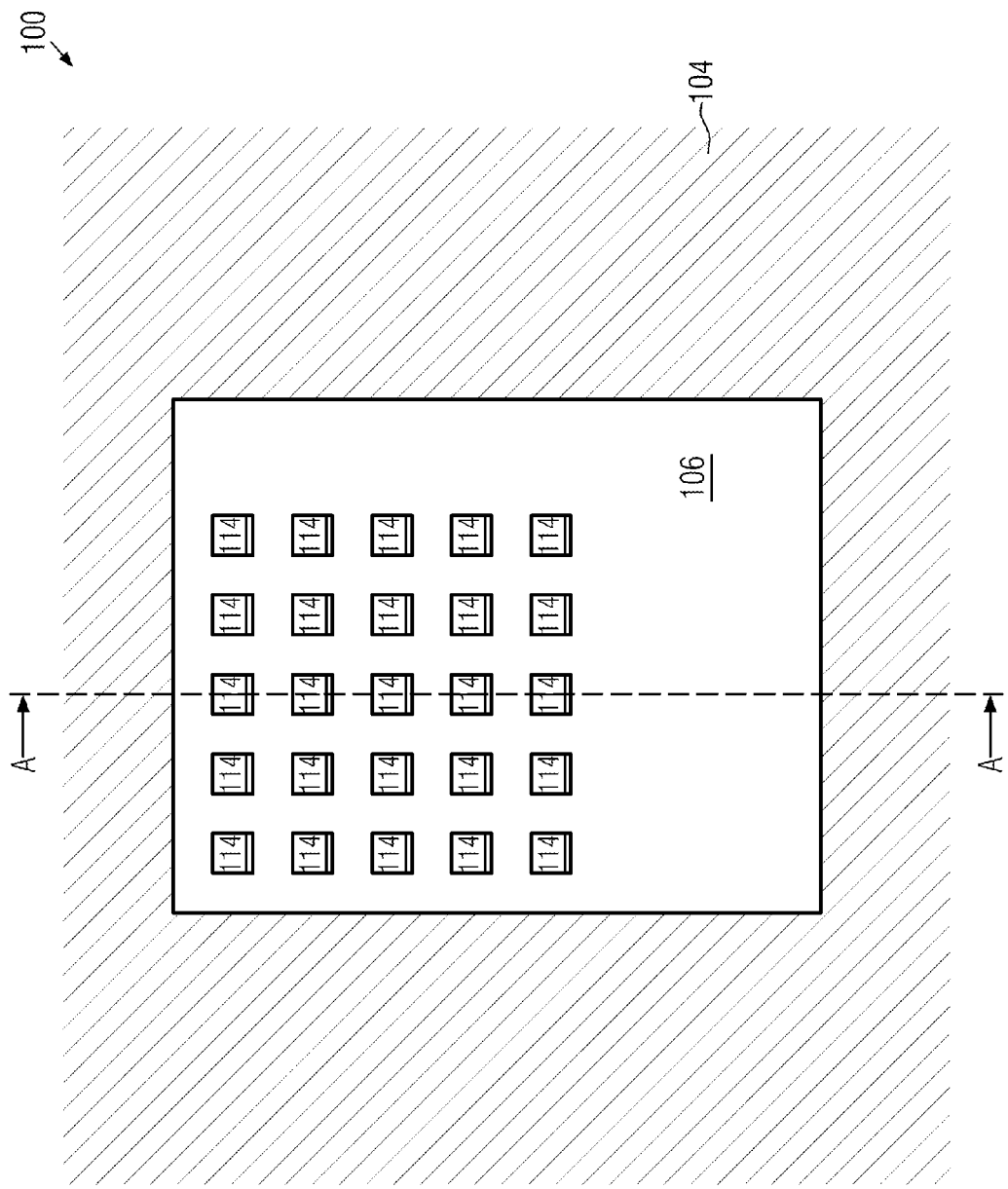
Figure 6B:
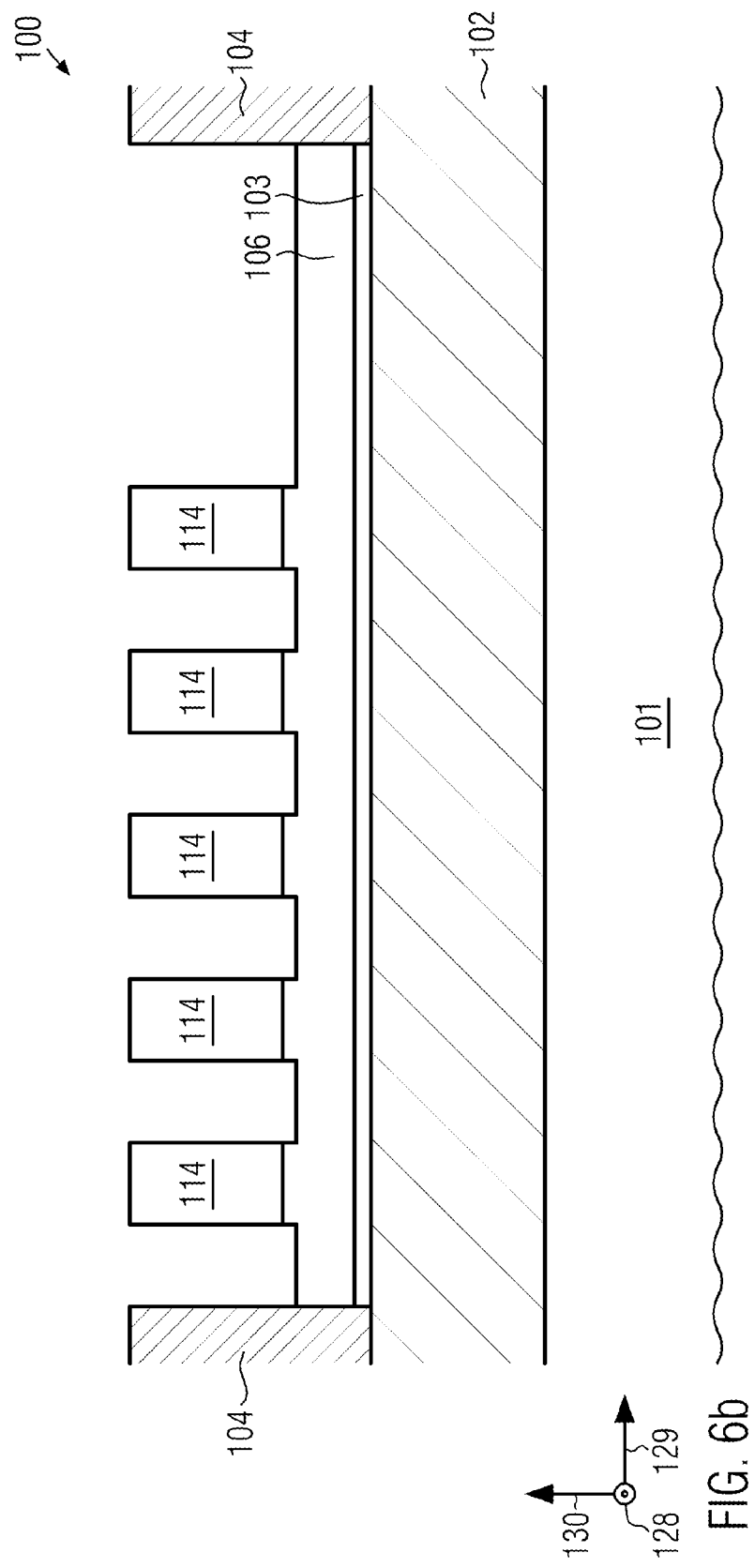

FIGS. 6a and 6b show schematic views of the semiconductor structure 100 in a later stage of the manufacturing process. FIG. 6a shows a schematic top view, and FIG. 6b shows a schematic cross-sectional view along the line A-A shown in FIG. 6a, corresponding to the cross-sections shown in FIGS. 1, 2, 3b, 4 and 5.

A second patterning process of the portion of the semiconductor layer 105 enclosed by the trench isolation structure 104 is performed for forming a plurality of nanowires 114 extending in the vertical direction 130 of the substrate 101. A length of the nanowires 114 in the vertical direction 130 may be greater than widths of the nanowires 114 in the first horizontal direction 128 and the second horizontal direction 129 of the substrate 101. In some embodiments, the length of the nanowires 114 in the vertical direction 130 may be more than twice, more than three times, more than five times and/or more than ten times the widths of the nanowires 114 in the first horizontal direction 128 and/or the second horizontal direction 129.

The portion 106 of the semiconductor layer 105 may be exposed between the nanowires 114, wherein substantially no residues of the portion 107 (see FIG. 4) of the semiconductor layer 105 remain in the gaps between the nanowires 114 and in the space between the nanowires 114 and the trench isolation structure 104. The nanowires 114 may include an upper portion formed of material from the portion 107 of the semiconductor layer 105. The length of the nanowires 114 in the vertical direction 130 of the substrate 100 may be greater than the thickness of the portion 107 of the semiconductor layer 105, so that each of the nanowires 114 includes a lower portion formed from material of the portion 106 of the semiconductor layer 105.

Thus, in each of the nanowires 114, a transition between a first doping corresponding to the doping of the portion 106 of the semiconductor layer 105 and a second doping corresponding to the doping of the portion 107 of the semiconductor layer 105 may be provided. In particular, each of the nanowires 114 may include a transition between a P-doped or an N-doped region, respectively, and a substantially undoped region, wherein the substantially undoped region is provided at a greater distance to the substrate 101 than the P-doped or N-doped region. Alternatively, each of the nanowires 114 may include a PN transition, if the nanowires are formed from a semiconductor layer 105 wherein the portion 107 is doped inversely to the doping of the portion 106.

In the second patterning process, a dummy structure similar to the dummy structure 108 (FIGS. 3a-3b) may be formed over the semiconductor structure 100. Similar to the dummy structure 108, this second dummy structure may have an elongated shape, wherein a width of the second dummy structure is substantially equal to or slightly greater than a resolution of a photolithography process employed for the formation of the second dummy structure. In embodiments wherein the width of the second dummy structure is reduced after the formation of the second dummy structure and/or wherein multiple patterning processes are employed for the formation of the second dummy structure, the width of the second dummy structure may be smaller than the resolution of the photolithography process.

However, the arrangement of the second dummy structure relative to the substrate 101 is different from the arrangement of the dummy structure 108. Whereas, as described above, the length direction of the dummy structure 108 extends along the first horizontal direction 128, the length direction of the second dummy structure may extend along the second horizontal direction 129. Thus, the second dummy structure extends across the portion of the semiconductor structure 100 enclosed by the trench isolation structure 104 in the second horizontal direction 129, and the width of the second dummy structure extends along the first horizontal direction 128. Hence, compared to the dummy structure 108, the arrangement of the second dummy structure is rotated by an angle of approximately 90 degrees.

Further features of the second patterning process may correspond to the first patterning process described above with reference to FIGS. 3a-5. In particular, spacer elements and/or a sacrificial material layer may be formed adjacent the second dummy structure, a planarization may be performed, some of the spacers and/or the optional sacrificial layer may be selectively etched relative to the material of the second dummy structure and one or more other spacers, and an etch process for selectively etching the material of the semiconductor layer 105 relative to the materials of the second dummy structure, the spacers remaining on the semiconductor structure 100 and/or the trench isolation structure 104 may be performed. A depth of the etch process may be approximately equal to the depth of the etch process employed in the first patterning process.

Thus, the nanowires 114 are formed at locations at which the semiconductor layer 105 is covered during both patterning processes by a respective dummy structure and/or a respective one of the spacers that remain on the semiconductor structure 100 when the material of the semiconductor layer 105 is etched.

The second dummy structure need not be arranged at the center of the portion of the semiconductor structure 100 enclosed by the trench isolation structure 104. Thus, a space for providing a gate contact via providing an electric contact to the gate electrode of the transistor to be formed in the semiconductor structure 100 may be provided on one side of the nanowires 114. For example, the space for providing the gate contact via may be located on the right side in the top view shown in FIG. 6a.

The present disclosure is not limited to embodiments wherein the first dummy structure 108 and the second dummy structure remain on the semiconductor structure 100 in the first and the second patterning process when the material of the semiconductor layer 105 is etched. Alternatively, in one of the patterning processes, or in both patterning processes, the dummy structure may be removed, and spacers adjacent the dummy structure formed of a different material than the dummy structure, for example the spacers 109, 111, may remain on the semiconductor structure 100 and may be used as a mask when the material of the semiconductor layer 105 is etched.

For example, in the first patterning process, the dummy structure 108 may be removed and the spacers 109, 111 may be used as an etch mask, and the second patterning process may be performed as described above. Thus, different from the configuration shown in FIG. 6a, only four rows of nanowires 114, the rows of nanowires being arranged along the first horizontal direction 128, may be formed.

In further embodiments, a greater or smaller number of spacers similar to spacers 109 to 112 may be formed for providing a different number of nanowires.

FIG. 7 shows a schematic cross-sectional view of the semiconductor structure 100 in a later stage of the manufacturing process. After the formation of the nanowires 114, a drain spacer 115 may be formed. The drain spacer 115 may be formed of a dielectric material having a relatively low dielectric constant, for example, silicon dioxide. Alternatively, the drain spacer 115 may be formed of silicon nitride or silicon oxynitride. The formation of the drain spacer 115 may include an anisotropic deposition process. In the anisotropic deposition process, a layer of a drain spacer material is deposited over the semiconductor structure 100, wherein a deposition rate of the drain spacer material over substantially horizontal portions of the semiconductor structure 100 is greater than a deposition rate of the drain spacer material over inclined portions of the semiconductor structure 100.

The substantially horizontal portions of the semiconductor structure 100 include the surface of the portion 106 of the semiconductor layer 105 exposed between the nanowires 114 and in the space between the nanowires 114 and the trench isolation structure 104, as well as top surfaces of the nanowires 114 and the trench isolation structure 104. The inclined portions of the semiconductor structure 100 include sidewalls of the trench isolation structure 104 and the nanowires 114.

The layer of drain spacer material formed in the anisotropic deposition process has a greater thickness on the horizontal portions of the semiconductor structure 100 than on the inclined portions, the thickness being measured in a direction substantially perpendicular to the surface of the respective portion of the semiconductor structure 100. In particular, a portion of the layer of drain spacer material on the surface of the exposed portion 106 of the semiconductor layer 105 between the nanowires 114 has a greater thickness than a portion of the layer of drain spacer material on the sidewalls of the nanowires 114.

The anisotropic deposition process used for forming the layer of drain spacer material may be a high density plasma chemical vapor deposition process. In embodiments wherein the drain spacer 115 includes silicon dioxide, in the high density plasma chemical vapor deposition process, a reactant gas including silane ($SiH_4$), oxygen ($O_2$) and a noble gas, for example, argon (Ar) or helium (He), may be used. Oxygen molecules and noble gas atoms in the reactant gas may be excited by the high density plasma source so that ions are formed.

A bias voltage applied to the semiconductor structure 100 and/or an electrode in the vicinity of the semiconductor structure 100 pulls the ions towards the surface of the semiconductor structure 100. Oxygen ions react with silane to form silicon dioxide that is deposited on the semiconductor structure 100, while the noble gas ions simultaneously sputter deposited material away. The rate at which material is sputtered may be particularly high in the vicinity of edges of the nanowires 114 and/or the trench isolation structure 104.

Parameters of the high density plasma chemical vapor deposition process, such as plasma density, bias voltage, composition of the reactant gas, pressure and temperature, may be adapted such that a net deposition of silicon dioxide on the semiconductor structure 100 occurs, whereas the simultaneous sputtering of the deposited material prevents a formation of overhangs at the edges of the nanowires 114 and/or the trench isolation structure 104. Thus, deposition of material in the gaps between the nanowires 114 and the space between the nanowires 114 and the trench isolation structure 104 may be obtained substantially without a formation of voids.

After the anisotropic deposition of the layer of drain spacer material, an isotropic etch process, which may, for example, be a dry etch process, may be performed. In the isotropic etch process, an etch rate of portions of the layer of drain spacer material on the inclined surface portions of the semiconductor structure 100 may be substantially equal to an etch rate of portions of the layer of drain spacer material on the substantially horizontal portions of the surface of the semiconductor structure 100.

In the isotropic etch process, portions of the layer of drain spacer material on top surfaces of the nanowires 114 and/or the top surface of the trench isolation structure 104 may be affected by an etchant used in the isotropic etch process to a greater extent than portions of the layer of drain spacer material on the surface of the portion 106 of the semiconductor layer 105 exposed between the nanowires 114. The etchant may interact with the top surface and the side surfaces of the portions of the layer of drain spacer material on top of the nanowires 114 and the trench isolation structure 104. To the contrary, there are no such side surfaces at the portions of the layer of drain spacer material on the portion 106 of the semiconductor layer 105 between the nanowires 114. Due to the relatively small extension of the nanowires 114 and the trench isolation structure 104 in the horizontal directions 128, 129, the areas of the side surfaces of the portions of the layer of drain spacer material on top of the nanowires 114 and the trench isolation structure 104 may be of about the same order of magnitude than the area of the top surfaces. Therefore, a faster removal of drain spacer material may be obtained at the top surfaces of the nanowires 114 and the trench isolation structure 104 than at the portions between the nanowires 114 and in the space between the nanowires 114 and the trench isolation structure 104.

The isotropic etch process may be performed until the layer of drain spacer material is present substantially only on the surface of the portion 106 of the semiconductor layer 105 between the nanowires 114 and in the space between the nanowires 114 and the trench isolation structure. The remaining portions of the layer of drain spacer material form the drain spacer 115, as shown in FIG. 7. The drain spacer 115 may cover the surface of the portion 106 of the semiconductor layer 105, wherein the nanowires 114 extend through openings in the drain spacer 115, and side surfaces and top surfaces of the nanowires 114 are exposed. Thus, the drain spacer 115 annularly encloses each of the nanowires 114.

After the formation of the drain spacer 115, gate insulation layer 116 may be formed on the exposed surfaces of the nanowires 114. In embodiments wherein the nanowires 114 include silicon, the gate insulation layer 116 may include silicon dioxide and may be formed by a thermal oxidation process. In some embodiments, the gate insulation layer 116 may be a silicon dioxide layer having a thickness of about 2 nm and may be formed by a thermal oxidation process performed for about 20 seconds at a temperature of about 850° C. in an oxidizing ambient, such as a gas comprising oxygen and/or water. In other embodiments, the gate insulation layer 116 may include a high-k material such as, for example, hafnium dioxide and may be formed by means of techniques for forming a high-k gate insulation layer on a semiconductor surface similar to techniques employed in the formation of planar field effect transistors comprising a gate insulation layer formed of a high-k material.

FIG. 8 shows a schematic cross-sectional view of the semiconductor structure 100 in a later stage of the manufacturing process. After the formation of the gate insulation layer 116, a gate electrode 117 may be formed over the semiconductor structure 100.

The gate electrode 117 may include a metal. The metal of the gate electrode 117 may be selected for adapting a work function of the gate electrode 117 to a work function of the semiconductor material of the nanowires 114. The material of the gate electrode 117 may depend on whether the transistor to be formed in the semiconductor structure 100 is a P-channel transistor or an N-channel transistor. In embodiments wherein an N-channel transistor is to be formed and wherein the portion 106 of the semiconductor layer 105 includes an N-type dopant, the metal of the gate electrode 117 may include La, LaN or TiN. In embodiments wherein a P-channel transistor is to be formed and wherein the portion 106 of the semiconductor layer 105 is P-doped, the metal of the gate electrode 117 may include Al, MN or TiN. In further embodiments, the gate electrode 117 may be formed of a semiconductor material, for example, polysilicon.

Similar to the drain spacer 115, the gate electrode 117 may be formed by anisotropically depositing a layer of the material of the gate electrode 117 over the semiconductor structure 100 and performing an isotropic etch process to remove portions of the layer of the material of the gate electrode 117 on sidewalls and top surfaces of the nanowires 114 and the trench isolation structure 104. The gate electrode 117 covers a surface of the drain spacer 115, wherein the nanowires 114 and the gate insulation layer 116 extend through openings in the gate electrode 117. Thus, the gate electrode 117 annularly encloses each of the nanowires 114.

After the formation of the gate electrode 117, portions of the gate insulation layer 116 that are not covered by the gate electrode 117 may be removed by means of an etch process. In embodiments wherein the gate insulation layer 116 includes silicon dioxide, this may be done by means of a wet etch cleaning process wherein the semiconductor structure 100 is exposed to diluted hydrofluoric acid.

Thereafter, a source spacer 118 may be formed. Similar to the drain spacer 115, the source spacer 118 may be formed of silicon dioxide, and techniques for forming the source spacer 118 may correspond to techniques employed in the formation of the drain spacer 115. In particular, the formation of the source spacer 118 may include an anisotropic deposition of a layer of the material of the source spacer 118 and an isotropic etch process. The anisotropic deposition process may be a high density plasma chemical vapor deposition process and the isotropic etch process may be a dry etch process.

The thickness of the source spacer 118 need not be substantially equal to a thickness of the drain spacer 115. In some embodiments, the source spacer 118 may have a greater thickness than the drain spacer 115. Thus, on the source side of the nanowires 114, more space may be provided for forming a source contact of the transistor to be formed in the semiconductor structure 100. For example, in some embodiments, the thickness of the source spacer 118 may be about twice the thickness of the drain spacer 115.

FIG. 9 shows a schematic cross-sectional view of the semiconductor structure 100 in a later stage of the manufacturing process. After the formation of the source spacer 118, an etch process adapted to selectively remove the material of the nanowires 114 relative to the materials of the source spacer 118 and the trench isolation structure 104 may be performed. In embodiments wherein the source spacer 118 and the trench isolation structure 104 include silicon dioxide and the nanowires 114 include silicon, the etch process may be an isotropic etch process adapted to selectively etch silicon relative to silicon dioxide.

In the etch process, a part of each of the nanowires 114 is removed. Another part of each of the nanowires 114 remains in the semiconductor structure 100. In FIG. 9, reference numeral 119 denotes distal ends of the parts of the nanowires 114 that remain in the semiconductor structure 100 after the etch process. The distal ends 119 of the parts of the nanowires 114 remaining in the semiconductor structure 100 after the etch process may be closer to the substrate 101 than the horizontal top surface of the source spacer 118. Thus, after the etch process, a recess is provided at the location of each of the nanowires 114, wherein the distal ends 119 of the nanowires 114 are exposed at the bottoms of the recesses and sidewalls of the recesses are formed by the source spacer 118.

After the etch process, the recesses may be filled with a semiconductor material 120. The semiconductor material 120 may include the same semiconductor material as the nanowires 114. For example, in embodiments wherein the nanowires 114 include silicon, the semiconductor material 120 may also include silicon. However, a doping of the semiconductor material 120 may be different from a doping of portions of the nanowires 114 adjacent the semiconductor material 120 that have been formed from the portion 107 of the semiconductor layer 105.

A type of dopant in the semiconductor material 120 may be the same as the type of dopant in the portion 106 of the semiconductor layer 105. In particular, in embodiments wherein an N-channel transistor is to be formed in the semiconductor structure 100 and the portion 106 of the semiconductor layer 105 includes an N-type dopant, the semiconductor material 120 may be N-doped. In embodiments wherein a P-channel transistor is to be formed in the semiconductor structure 100 and the portion 106 of the semiconductor layer 105 is P-doped, the semiconductor material 120 may include a P-type dopant. In some embodiments wherein the semiconductor material 120 is N-doped, the semiconductor material 120 may include arsenic at a dopant concentration in a range from about $10^{15}$-$10^{21}$ cm$^{-3}$ (solid solubility limit), for example, a concentration of about $10^{21}$ cm$^{-3}$. The dopant concentration in the semiconductor material 120 may be greater than the dopant concentration in the portion 106 of the semiconductor layer 105. The portion 106 of the semiconductor layer 105 may receive a higher thermal budged, and its dopants may show more diffusion into the portion 107 of the semiconductor layer 105.

As will be detailed below, a drain region of a transistor to be formed in the semiconductor structure 100 may be formed from the portion 106 of the semiconductor layer 105, a channel region may be formed from portion 107, and a source region may be formed from the semiconductor material 120. Providing a lower dopant concentration in the portion 106 of the semiconductor layer 105 may help to avoid or at least reduce dopants floating the channel region.

Source regions with less thermal budged may be produced with a doping of $10^{21}$ cm$^{-3}$ (solid solubility limit) to receive the best source resistance. A low drain resistance may be provided by providing a relatively thick portion 106 of the semiconductor layer 105 from which the drain region is formed.

In embodiments wherein the semiconductor material 120 is P-doped, the semiconductor material 120 may include boron at a concentration in a range from about $10^{19}$-$10^{21}$ cm$^{-3}$, for example, at a concentration of about $10^{20}$ cm$^{-3}$.

The semiconductor material 120 may be deposited by means of a selective epitaxial growth process, for example, chemical vapor deposition process, a plasma enhanced chemical vapor deposition process, a molecular beam epitaxy process or a metal organic chemical vapor deposition process, as described above in the context of the formation of the semiconductor layer 105. Thus, in the deposition of the semiconductor material 120, substantially no semiconductor material or only a small amount of semiconductor material is deposited on the surface of the source spacer 118 and the trench isolation structure 104. The semiconductor material 120 may have a thickness in a range from about 5-15 nm, for example, a thickness of about 10 nm.

The semiconductor material 120 may be in situ doped. For this purpose, a dopant or a chemical compound comprising a dopant may be supplied during the deposition of the semiconductor material 120.

After the deposition of the semiconductor material 120, an annealing process may be performed. The annealing process may activate dopants in the semiconductor material 120. Moreover, the annealing process may cause some diffusion of dopants from the semiconductor material 120, so that a smoother transition between the doping of the semiconductor material 120 and the adjacent portions of the nanowires 114 formed from the portion 107 of the semiconductor layer 105 is obtained.

The annealing process may employ a combination of a rapid thermal annealing (RTA) process and a laser spike annealing (LSA) process, wherein the rapid thermal annealing process may be performed for about 5 seconds at a temperature of about 920° C., and the laser spike annealing process may be performed for about 0.002 seconds at a temperature of about 1225° C.

Figure 10A:
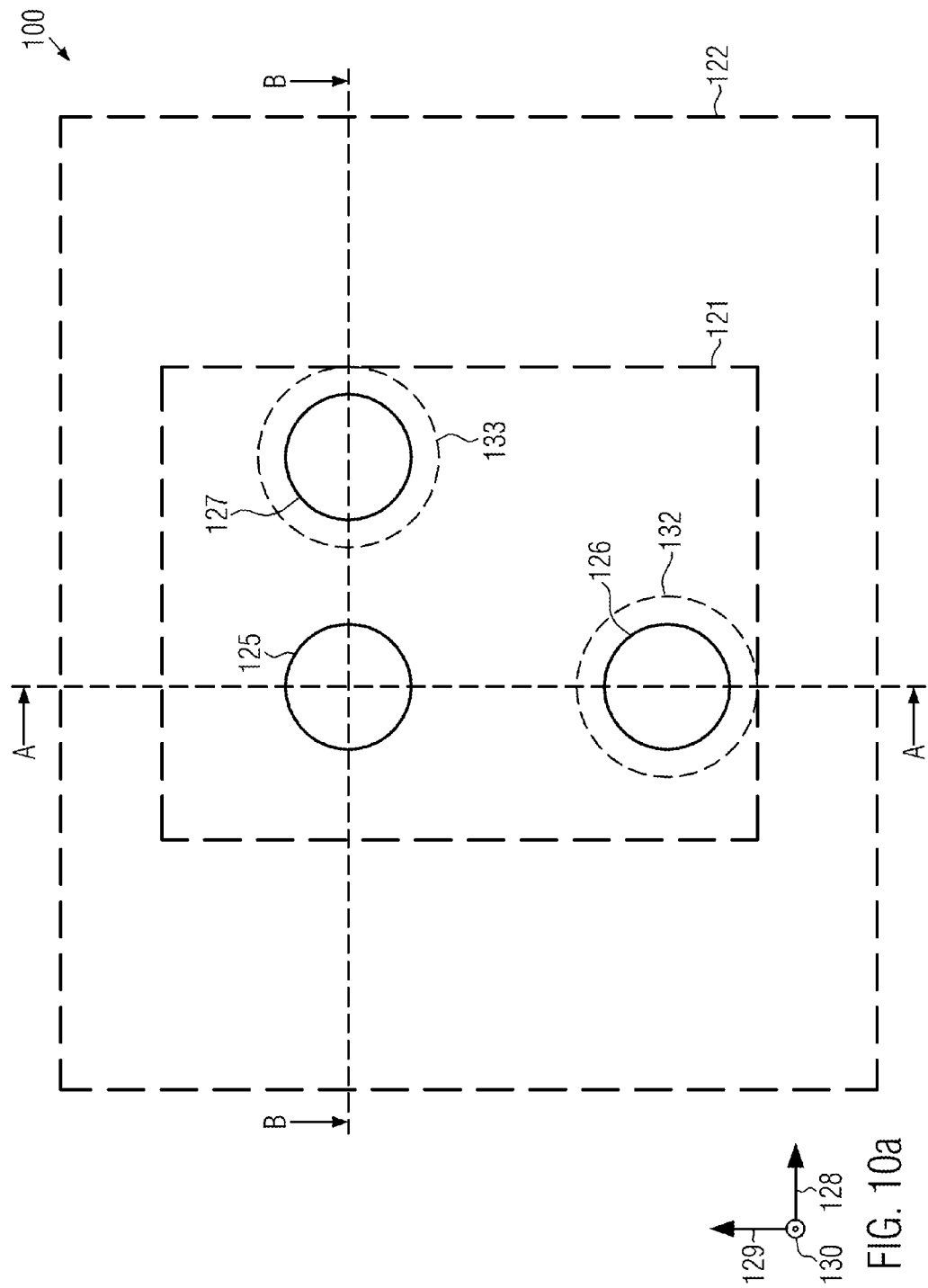
Figure 10B:
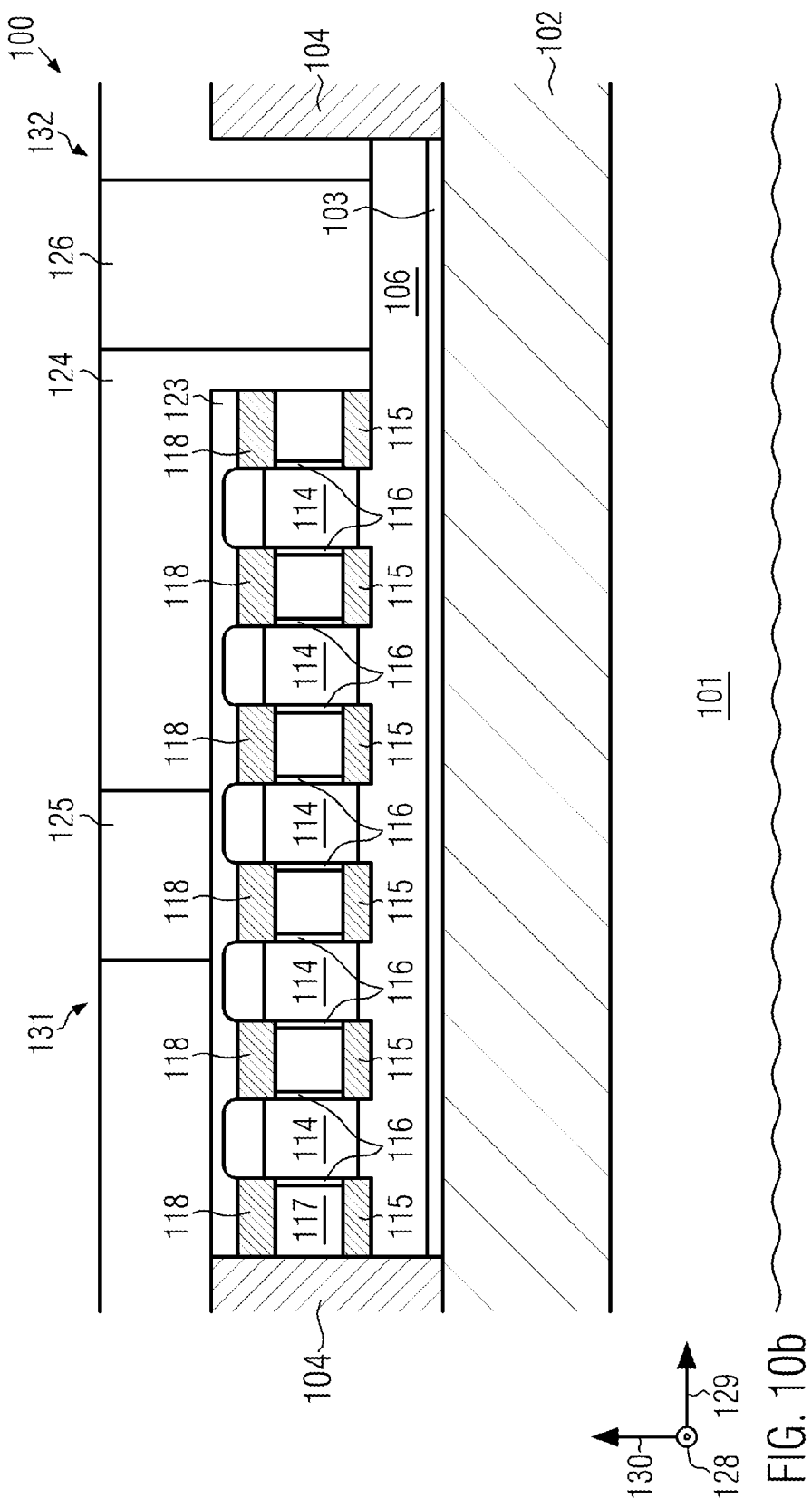
Figure 10C:
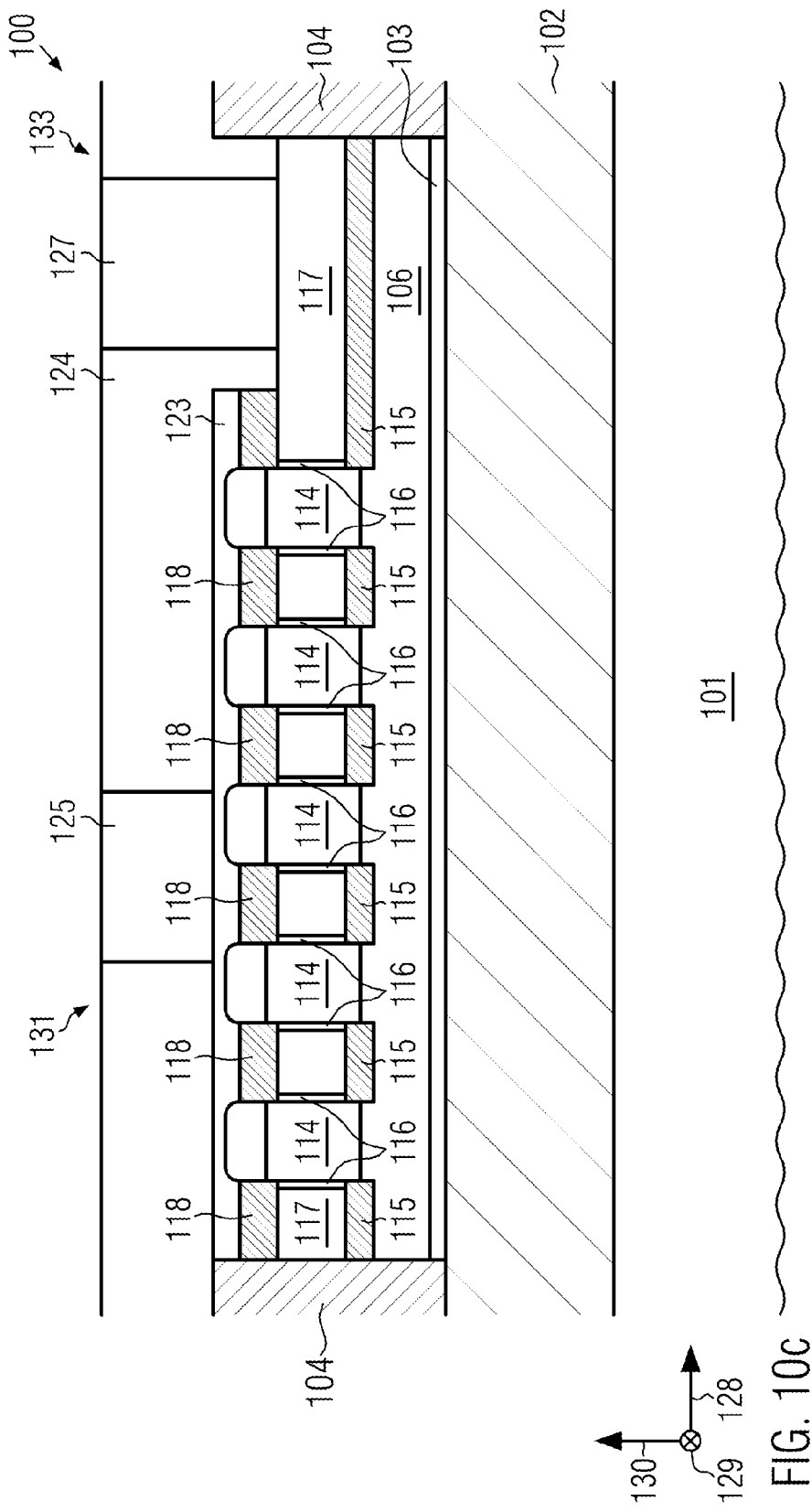

FIGS. 10a, 10b and 10c show schematic views of the semiconductor structure 100 in a later stage of the manufacturing process. FIG. 10a shows a schematic top view. FIG. 10b shows a schematic cross-sectional view of the semiconductor structure 100 along the line A-A, corresponding to the cross-sectional views of FIGS. 1, 2, 3b, 4, 5, 6b, 7, 8 and 9. FIG. 10c shows a schematic cross-sectional view along the line B-B. Thus, FIG. 10c shows a cross-sectional view of the semiconductor structure 100 along a plane that is perpendicular to the plane of the cross-section of FIG. 10b.

After the deposition of the semiconductor material 120, a source contact layer 123 may be formed. The source contact layer 123 may include a silicide. For forming the source contact layer 123, a silicon layer, for example a layer of polysilicon, may be formed over the semiconductor structure 100. Thereafter, a layer of a metal, for example a layer of nickel, tungsten and/or titanium, may be deposited on the silicon layer. Thereafter, an annealing process, for example a rapid thermal annealing process, may be performed for initiating a chemical reaction between the metal and the silicon. In the chemical reaction, silicide is formed. In addition to the material of the silicon layer deposited over the semiconductor structure 100, a part of the semiconductor material 120 may also react with the metal and form a silicide. Thus, an interface between silicide and doped semiconductor material may be provided more closely to the substrate 101 than the surface of the semiconductor material 120 that is obtained directly after the deposition of the semiconductor material 120. However, a portion of unreacted doped semiconductor material 120 may remain on the nanowires 114, so that there is a transition between differently doped semiconductor materials at the distal ends 119 of the nanowires 114.

After the annealing process performed for forming silicide, excess metal may be removed by means of a cleaning process.

After the formation of the source contact layer 123, the semiconductor structure 100 includes a transistor 131. The portion 106 of the semiconductor layer 105 below the nanowires 114 forms a drain of the transistor 131. Portions of the nanowires 114 that have been formed from the portion 107 of the semiconductor layer 105 provide a channel region of the transistor 131 and a source of the transistor 131 is provided by the semiconductor material 120 and the source contact layer 123.

The transistor 131 may be switched between an electrically conductive on-state and an off-state having only a relatively low electrical conductivity by applying an electric voltage to the gate electrode 117. The gate electrode 117 is electrically insulated from the channel region in the nanowires 114 by the gate insulation layer 116, and is isolated from the drain region and the source region by the drain spacer 115 and the source spacer 118, respectively. Since the channel region of the transistor 131 is provided in the nanowires 114, and the gate electrode 117 annularly encloses the nanowires 114, the gate electrode 117 extends all around the channel region, which can improve the controllability of the channel that is obtainable by applying a voltage to the gate electrode 117.

Moreover, in the transistor 131, the drain region 106, the channel region in the nanowires 114 and the source provided in the form of the semiconductor material 120 and the source contact layer 123 are arranged along the vertical direction 130. A gate length of the transistor 131 may substantially correspond to a thickness of the gate electrode 117. For reducing an extension of the transistor 131 in the horizontal directions 128, 129, a scaling of the gate length of the transistor 131 is not necessary. Shrinking the extension of the transistor 131 in the horizontal directions 128, 129 may be limited only by the diameter and the pitch of the nanowires 114.

An interface between the doped semiconductor material in the drain of the transistor 131 and the substantially undoped or inversely doped semiconductor material in the channel of the transistor 131 is provided by the interface between the portions 106 and 107 of the semiconductor layer 105. An interface between the doped semiconductor material in the source of the transistor 131 and the substantially undoped or inversely doped semiconductor material in the channel region is provided by the interface between the semiconductor material 120 and the nanowires 114.

The location of the interface between the source region and the channel region of the transistor 131 relative to the gate electrode 117 may be controlled by selecting the thickness of the source spacer 118 and the amount of semiconductor material that is removed in the etching of the nanowires 114 that is performed after the formation of the source spacer 118. Thus, the location of the interface between the channel region and the source region may be relatively precisely controlled.

After the formation of the source contact layer 123, the source contact layer 123, the source spacer 118, the gate electrode 117 and the drain spacer 115 may be removed in a region 132 of the semiconductor structure 100, so that the portion 106 of the semiconductor layer 105 forming the drain of the transistor 131 is exposed in the region 132. In a region 133, the source contact layer 123 and the source spacer 118 may be removed, so that the gate electrode 117 is exposed in the region 133. The regions 132, 133 may be located adjacent the trench isolation structure 104. In FIG. 10a, the location of the trench isolation structure 104 is schematically indicated by dashed lines 121, 122. The removal of material in the regions 132, 133 may be performed by means of techniques of photolithography and etching.

Thereafter, an interlayer dielectric 124 may be deposited over the semiconductor structure 100. In some embodiments, the interlayer dielectric 124 may include silicon dioxide and may be deposited by a chemical vapor deposition or plasma-enhanced chemical vapor deposition process. Optionally, after the deposition of the interlayer dielectric 124, a chemical mechanical polishing process may be performed for planarizing the surface of the interlayer dielectric 124.

Thereafter, a source contact via 125 may be formed over the source contact layer 123, a drain contact via 126 may be formed in the region 132 of the semiconductor structure 100, and a gate contact via 127 may be formed in the region 133 of the semiconductor structure 100 for providing electrical contact to the source, drain and gate of the transistor 131. The contact vias 125, 126, 127 may be filled with an electrically conductive material, for example tungsten. The contact vias 125, 126, 127 may be formed by means of processes of photolithography, etching and deposition.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure comprising a substrate and a nanowire above said substrate, the nanowire comprising a first semiconductor material and extending in a vertical direction of said substrate;
forming a material layer above said substrate, the material layer annularly enclosing said nanowire;
selectively removing a first part of said nanowire relative to said material layer, wherein a second part of said nanowire is not removed, a distal end of said second part of said nanowire distal from said substrate being closer to said substrate than a surface of said material layer so that said semiconductor structure has a recess at a location of said nanowire, the distal end of said nanowire being exposed at the bottom of said recess; and
filling said recess with a second semiconductor material, the second semiconductor material being differently doped than said first semiconductor material.

2. The method of claim 1, wherein said semiconductor structure further comprises:
a gate electrode annularly enclosing said nanowire; and
a gate insulation layer between said nanowire and said gate electrode;
wherein said material layer comprises an electrically insulating material and is formed above said gate electrode.

3. The method of claim 2, wherein said semiconductor structure further comprises an electrically insulating first spacer annularly enclosing said nanowire, said first spacer being provided between a semiconductor layer provided below said nanowire and said gate electrode, said material layer forming a second electrically insulating spacer annularly enclosing said nanowire.

4. The method of claim 1, wherein forming said material layer comprises anisotropically depositing a material of said material layer and performing an isotropic etch process to remove a portion of the material of said material layer on sidewalls of said nanowire.

5. The method of claim 1, wherein removing said first part of said nanowire comprises performing an isotropic etch process selectively removing said first semiconductor material relative to a material of said material layer.

6. The method of claim 1, wherein filling said recess comprises performing a deposition process, said second semiconductor material being in situ doped during said deposition process.

7. A method, comprising:

providing a semiconductor-on-insulator structure comprising a substrate, a dielectric layer on said substrate and a first semiconductor layer on said dielectric layer;

reducing a thickness of said first semiconductor layer;

after reducing the thickness of said first semiconductor layer, epitaxially depositing a second semiconductor layer on said first semiconductor layer, the second semiconductor layer comprising a first portion on said first semiconductor layer and a second portion on the first portion of said second semiconductor layer, wherein a doping of the first portion of said second semiconductor layer is different from a doping of a second portion of said second semiconductor layer; and patterning said second portion of said second semiconductor layer, the patterning forming a nanowire extending in a vertical direction of said substrate, wherein a part of said first portion of said semiconductor layer that is adjacent said nanowire and is not covered by said nanowire remains in said semiconductor structure.

8. The method of claim 7, wherein a thickness of said first portion of said second semiconductor layer is greater than at least one of the reduced thickness of said first semiconductor layer, five times the reduced thickness of said first semiconductor layer and ten times the reduced thickness of said first semiconductor layer.

9. The method of claim 8, wherein a thickness of said second portion of said second semiconductor layer is greater than at least one of the thickness of said first portion of said second semiconductor layer and twice the thickness of said first portion of said second semiconductor layer.

10. The method of claim 7, wherein said first portion of said second semiconductor layer is one of P-doped and N-doped, and wherein said first semiconductor layer and said second portion of said second semiconductor layer are substantially undoped.

11. The method of claim 7, further comprising forming a first spacer annularly enclosing said nanowire, the first spacer comprising an electrically insulating material.

12. The method of claim 11, further comprising:

forming a gate insulation layer on a portion of said nanowire that is not covered by said first spacer; and after the formation of said gate insulation layer, forming a gate electrode above said first spacer, the gate electrode annularly enclosing said nanowire.

13. The method of claim 12, further comprising removing a portion of said gate insulation layer that is not covered by said gate electrode after the formation of said gate electrode.

14. A method of claim 12, further comprising forming a second spacer above said gate electrode, the second spacer annularly enclosing said nanowire, the second spacer comprising an electrically insulating material.

15. The method of claim 14, further comprising selectively removing a first part of said nanowire relative to said second spacer, wherein a second part of said nanowire is not removed, a distal end of said second part of said nanowire distal from said substrate being closer to said substrate than a surface of said second spacer so that a recess is provided at a location of the nanowire, the distal end of said nanowire being exposed at the bottom of said recess.

16. The method of claim 15, further comprising filling said recess with a semiconductor material, the semiconductor material being doped with a dopant of the same type as said first portion of said second semiconductor layer.

17. The method of claim 16, further comprising performing an annealing process after filling said recess with said semiconductor material.

18. The method of claim 17, wherein said annealing process comprises at least one of a rapid thermal anneal and a laser spike anneal.

19. The method of claim 17, further comprising forming a silicide at said recess filled with said semiconductor material.

20. The method of claim 7, wherein a plurality of nanowires are formed on a contiguous portion of said first semiconductor layer in the patterning of said second portion of said semiconductor layer, and wherein a channel region of one field effect transistor is formed from said plurality of nanowires, said contiguous portion of said first semiconductor layer providing one of a source and a drain of said field effect transistor.

* * * * *

UNITED STATES PATENT AND TRADEMARK OFFICE
CERTIFICATE OF CORRECTION

| | | |
|---|---|---|
| PATENT NO. | : 8,835,255 B2 | Page 1 of 1 |
| APPLICATION NO. | : 13/747907 | |
| DATED | : September 16, 2014 | |
| INVENTOR(S) | : Baldauf et al. | |

It is certified that error appears in the above-identified patent and that said Letters Patent is hereby corrected as shown below:

On the Title Page item (72), line 3, delete "Hermann" and insert therefor -- Herrmann --.

Signed and Sealed this
Twenty-seventh Day of January, 2015

Michelle K. Lee
*Deputy Director of the United States Patent and Trademark Office*